United States Patent
Bramanti

(10) Patent No.: US 9,641,181 B2
(45) Date of Patent: *May 2, 2017

(54) ELECTRONIC DEVICE FOR IMPLEMENTING DIGITAL FUNCTIONS THROUGH MOLECULAR FUNCTIONAL ELEMENTS

(71) Applicant: STMicroelectronics S.R.L., Agrate Brianza (IT)

(72) Inventor: Alessandro Paolo Bramanti, Maglie (IT)

(73) Assignee: STMicroelectronics S.r.l., Agrate Brianza (IT)

( * ) Notice: Subject to any disclaimer, the term of this patent is extended or adjusted under 35 U.S.C. 154(b) by 0 days.

This patent is subject to a terminal disclaimer.

(21) Appl. No.: 14/983,896

(22) Filed: Dec. 30, 2015

(65) Prior Publication Data

US 2016/0118989 A1 Apr. 28, 2016

Related U.S. Application Data

(63) Continuation of application No. 14/089,586, filed on Nov. 25, 2013, now Pat. No. 9,257,989.

(30) Foreign Application Priority Data

Nov. 29, 2012 (IT) .............................. MI2012A2041

(51) Int. Cl.
*H03K 19/19* (2006.01)
*H03K 19/195* (2006.01)
(Continued)

(52) U.S. Cl.
CPC ............ *H03K 19/195* (2013.01); *B82Y 10/00* (2013.01); *G06N 99/007* (2013.01);
(Continued)

(58) Field of Classification Search
CPC ........................ H01L 27/11803; H03K 19/195
See application file for complete search history.

(56) References Cited

U.S. PATENT DOCUMENTS 6,339,227 B1  1/2002  Ellenbogen
7,186,380 B2  3/2007  Chen et al.
(Continued)

OTHER PUBLICATIONS

Arima et al., "Toward quantum-dot cellular automata units: thiolated-carbazole linked bisferrocenes," *Nanoscale* 4:813-823, 2012.

(Continued)

*Primary Examiner* — Matthew Reames
(74) *Attorney, Agent, or Firm* — Seed IP Law Group LLP

(57) ABSTRACT

An electronic device for implementing digital functions comprising a first and a second electrode regions, separated by an interposing region comprising a dielectric region, is described. The first and the second electrode regions comprise at least one first electrode and at least one second electrode, respectively, configured to generate in the interposing region an electric field depending on an electric potential difference applied thereto. In the interposing region, a molecular layer is comprised, which is composed of a plurality of molecules, each being capable of assuming one or more states, in a controllable manner, depending on a sensed electric field. The dielectric region has a spatially variable dielectric profile, to determine a respective spatially variable field profile of the sensed electric field at the molecular layer.

20 Claims, 21 Drawing Sheets

(51) Int. Cl.
  *H01L 51/00* (2006.01)
  *B82Y 10/00* (2011.01)
  *H01L 49/00* (2006.01)
  *G06N 99/00* (2010.01)
  *H01L 27/118* (2006.01)
  *B82Y 40/00* (2011.01)

(52) U.S. Cl.
  CPC ...... *H01L 27/11803* (2013.01); *H01L 49/006* (2013.01); *H01L 51/0098* (2013.01); *B82Y 40/00* (2013.01); *Y10S 977/774* (2013.01); *Y10S 977/89* (2013.01); *Y10S 977/933* (2013.01)

(56) References Cited

U.S. PATENT DOCUMENTS 9,257,989 B2 * 2/2016 Bramanti ............ H03K 19/195
2003/0058697 A1 3/2003 Tour et al.

OTHER PUBLICATIONS

Cannara et al., "Thermo-mechanical probe storage at Mbps single-probe data rates and Tbit in$^{-2}$ densities," *Nanotechnology* 19:395305, 2008, 6 pages.

Cheam et al., "Mass Production of Room Temperature Single Electron Transistors using Step & Flash Imprint Lithography and Lift-off Technique," IEEE Conference on Nanotechnology, NANO '08, Arlington, TX, Aug. 18-211, 2008, pp. 175-178, 2008.

Chua et al., "High-stability ultrathin spin-on benzocyclobutene gate dielectric for polymer field-effect transistors," *Applied Physics Letters* 84(17):3400-3402, Apr. 26, 2004.

Crocker et al., "Molecular QCA Design with Chemically Reasonable Constraints," *ACM J. Emerg. Technol. Comput. Syst.* 4(2), Article 9, Apr. 2008, 22 pages.

Frost et al., "Carbon Nanotubes for Quantum-Dot Cellular Automata Clocking," 4th IEEE Conference on Nanotechnology, Aug. 16-19, 2004, pp. 171-173, 2004.

Hanisch et al., "All-sputtered contacts for organic solar cells," *Thin Solid Films* 516:7241-7244, 2008.

Hennessy et al., "Clocking of molecular quantum-dot cellular automata," *J. Vac. Sci. Technol. B* 19(5):1752-1755, Sep./Oct. 2001.

Hikono et al., "Electron confinement in a metal nanodot monolayer embedded in silicon dioxide using ferritin protein," *Applied Physics Letters* 88:023108, 2006, 3 pages.

Jiao et al., "Building Block for the Molecular Expression of Quantum Cellular Automata. Isolation and Characterization of a Covalently Bonded Square Array of Two Ferrocenium and Two Ferrocene Complexes," *J. Am. Chem. Soc.* 125:7522-7523, 2003.

Karim et al., "Characterization of the Displacement Tolerance of QCZ Interconnects," IEEE International Workshop on Design and Test of Nano Devices, Circuits and Systems, pp. 49-52, 2008.

Lent et al., "Clocked Molecular Quantum-Dot Cellular Automata," *IEEE Transactions on Electronic Devices* 50(9):1890-1896, Sep. 2003.

Likharev, "Single-Electron Devices and Their Applications," *Proc. IEEE* 87:606-632, Apr. 1999.

Lu et al., "High-κ Polymer Nanocomposites as Gate Dielectrics for Organic Electronics Applications," Proceeding of the 57$^{th}$ Electronic Components and Technology Conference, Reno, NV, May 28, 2007-Jun. 1, 2007, pp. 453-457, 2007.

Matsumoto et al., "Room temperature operation of a single electron transistor made by the scanning tunneling microscope nanooxidation process for the Tio$_x$/Ti system," *Appl. Phys. Lett.* 68(1):34-36, Jan. 1, 1996.

Mescheder et al., "Properties of $SiO_2$ electret films charged by ion implantation for MEMS-based energy harvesting systems," *J. Micromech. Microeng.* 19:094003, 2009, 6 pages.

Search Report and Written Opinion for Italian application No. IT MI20122041, dated Jul. 19, 2013, 8 pages.

* cited by examiner

ELECTRONIC DEVICE FOR IMPLEMENTING DIGITAL FUNCTIONS THROUGH MOLECULAR FUNCTIONAL ELEMENTS

BACKGROUND

Technical Field

The present disclosure relates to an electronic device for implementing digital functions and miniaturized logic gates, based on molecular functional elements, and to a method for digital computation implemented by such a device.

An electronic processing system, employing one or more of the above-mentioned devices, and a method for manufacturing the same device are also within the disclosure.

Description of the Related Art

The evolution of microelectronics, particularly applied to processors and electronic computers based on integrated circuits, has developed over the last decades while keeping the extraordinary pace foreseen by the so-called "Moore's Law". This emerged particularly in the increasingly improved miniaturization of integrated electronic circuits, or in the increasing computational capacity that can be obtained while keeping dimensions constant, which in turn depends on the number of functional elements (for example, logic gates) that can be integrated in a given space, and on the operating speed of such functional elements.

This evolution was made possible due to improvements mainly in technology, while the founding principles of the micro-electronic circuits, which for decades have been based on transistors as base elements, remained unaltered.

Actually, the above-mentioned evolution involved the design, manufacturing and integration of more and more fast, miniaturized, and increasingly energy-efficient transistors. Regarding miniaturization, the key aspect was, and still is, the ability to use lithographic manufacturing processes on smaller and smaller spatial scales.

However, such technological evolution seems to be reaching its limit. Costs and feasibility of lithographic processes on scales that are smaller than the current ones appear to be problematic.

In order to overcome the barriers and limits set forth above, it is felt a need for a quality breakthrough related to concept itself of devices, processing systems, and electronic computers, according to what may be briefly defined as a transition from micro- to nano-electronics.

A transition from micro- to nano-electronics involves particularly applying physical laws that are even more fundamental than those employed in transistors, for example, quantum phenomena on an atomic-molecular scale.

Therefore, research in this field pursues the chance to devise so-called nano-electronic "transistor-like" devices (such as "molecular transistors" or "tri-gate transistors") that, while being based on quantum phenomena, aim to reproduce the operation of conventional transistors. However, nano-electronic "transistor-like" solutions have severe drawbacks, since to date they do not allow obtaining the same performance of the state-of-the-art micro-electronic transistors. Furthermore, a transistor-based system includes complex interconnections, which are obtained by lithographic processes, thus not allowing overcoming the above-mentioned limitations of such lithographic processes.

A further line of research, mostly developed by academic institutions, relates to a type of so-called "transistor-less" devices, i.e., devices not involving the use of transistors.

This line of research comprises, e.g., QCAs—"Quantum-dot Cellular Automata". QCAs are based on the principle that, since the properties of materials change radically at the nano-scale, at such a scale processing methods, exploiting quantum phenomena at an atomic-molecular scale, such as the electrostatic interaction combined with quantum tunneling effect and quantum charge confinement, can operate. Such processing methods can be much more efficient compared to those based on switches, such as transistors.

QCAs provide for functional units composed of, e.g., 6-dot cells (i.e., six atoms or groups of atoms), capable to assume two different polarized states and a neutral state, corresponding to different charge configurations around the different atoms or groups of atoms, each equivalent to a respective "confinement site". Each cell can be obtained, for example, by means of two molecules, each of which comprising three confinement sites. The possibility to obtain, by means of QCAs, single functional units such as memory cells, binary lines, logic inverters, up to single Boolean logic gates, has been shown.

However, to date, QCAs did not prove to be capable of implementing complex processors, since the implementation of prior art complex QCA cell processors use substantially conventional lithographic processes, to the extent of the spatial resolution of a single QCA cell, with all the above-mentioned limitations thereof.

A further drawback of prior art QCA solutions, particularly at a molecular scale, is that they are implemented on the basis of molecules that are highly symmetrical in structure and electric configuration, while real molecules tend to be asymmetric, at least due to the deposition thereof on substrates, together with other possibly similar molecules.

The use of not exactly symmetric molecules is a severe limitation on the performance that can be obtained by QCAs.

From what has been stated above, it shall be apparent that the desire to provide nano-electronic integrated devices with digital processing performance comparable to those of current micro-electronic circuits and processors, and at a reasonable cost, is largely unmet.

BRIEF SUMMARY

One embodiment of the present disclosure is an electronic device based on molecular functional elements, for implementing digital functions and miniaturized logic gates, as well as a method for manufacturing the same device. Some embodiments are an electronic processing system, employing one or more of such devices, and a related method for electronic computation, which are improved so as to at least partially obviate the drawbacks described herein above with reference to the prior art.

Particularly, an electronic device is proposed, that is based on physical quantum phenomena, while allowing the integration of several functional elements, such as to compose a processor or a complex logic network, and which can be manufactured at reasonable costs and provide high performance.

One embodiment is an electronic device for implementing digital functions that includes an interposing region that includes a dielectric region; and a first electrode region and a second electrode region separated from each other by the interposing region, wherein said first and second electrode regions include a first electrode and a second electrode, respectively, that are configured to generate an electrode electric field in the interposing region depending on an electric potential difference to be applied to the first and second electrodes. The interposing region includes a molecular layer including a plurality of molecules, each configured to assume one or more electric states, in a controllable manner, according to a sensed electric field. The dielectric region has a spatially variable dielectric profile and is configured to determine a respective field profile of said electrode electric field and to spatially modulate said sensed electric field at the molecular layer.

One embodiment of the disclosure is an electronic processing system that includes such a device.

A method for electronic digital computation according to one embodiment of the disclosure includes:

applying a potential difference between a first electrode and a second electrode of an electronic device that includes an interposing region between the electrodes, the interposing region including a dielectric region having a spatially variable dielectric profile, the interposing region including a molecular layer that includes a plurality of molecules, each configured to assume one or more electric states in a controllable manner according to a sensed electric field, the applying including generating an electrode electric field in the interposing region; and affecting the states of the molecules of the molecular layer by spatially modulating the sensed electric field at the molecular layer, said spatially modulating depending on a spatially variable field profile determined by the spatially variable dielectric profile of the dielectric region.

BRIEF DESCRIPTION OF THE SEVERAL VIEWS OF THE DRAWINGS

Further characteristics and advantages of the device, the system, the computational method and the manufacturing method according to the disclosure will be apparent from the description set forth below of preferred implementation examples, given by way of indicative, non-limiting example, with reference to the appended Figures, in which.

DETAILED DESCRIPTION

Figure 1:
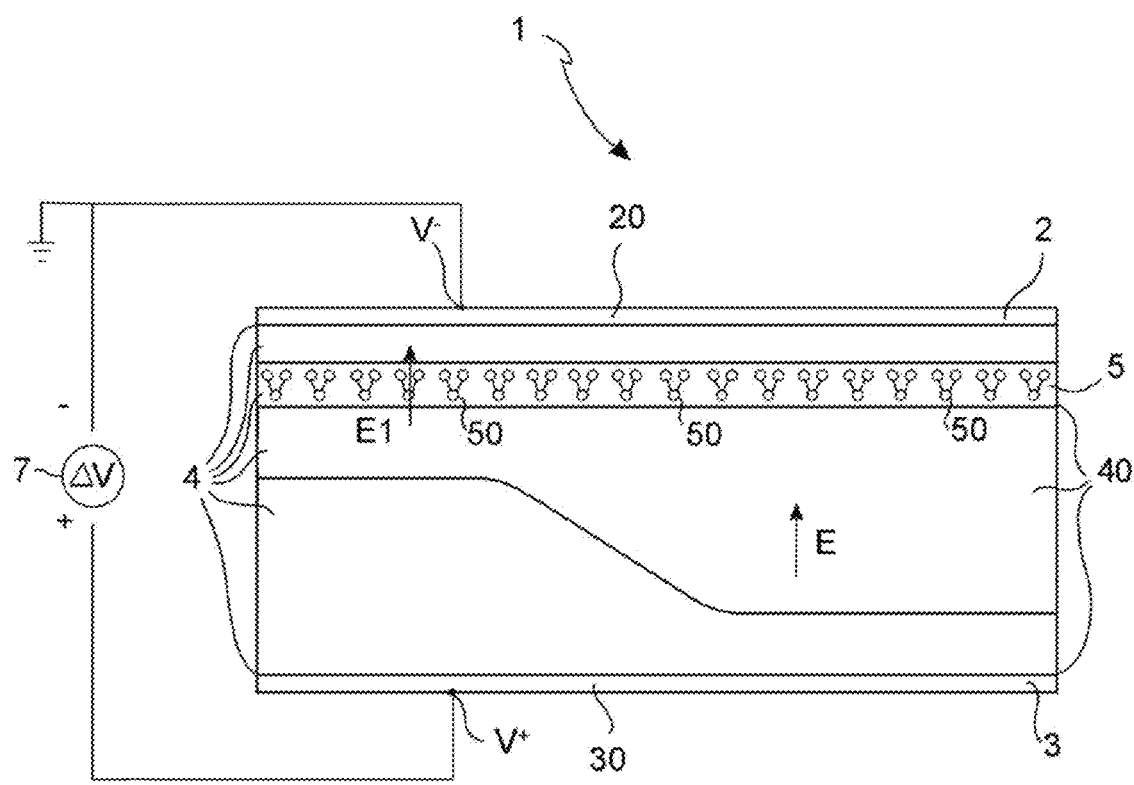
FIG. 1 illustrates a sectional view of a device according to an embodiment of the present disclosure.

With reference to FIG. 1, an electronic device 1 for implementing digital functions will be now described, according to a preferred embodiment of the disclosure.

As shown in the sectional view of FIG. 1, the electronic device comprises: a first electrode region 2 and a second electrode region 3, separated by an interposing region 4 comprising a dielectric region 40. The first 2 and second 3 electrode regions comprise at least one first electrode 20 and at least one second electrode 30, respectively, which are configured to generate an electrode electric field E in the interposing region 4 (particularly, at each point of the interposing region 4) depending on an electric potential difference ΔV applied to the first and second electrodes.

In FIG. 1, such a potential difference ΔV corresponds to the difference between the potentials V+ and V− applied by a source 7 (for example, a voltage generator 7) to the second electrode 30 and the first electrode 20, respectively.

It shall be noticed that the electrodes 20, 30 are typically in metal, but they can also be made of other materials, such as, for example, graphene. In each case, each of such electrodes is iso-potential, and it immediately acquires the potential applied thereto by the source 7. Therefore, the potential difference varies over time, as dictated by the source 7, thus determining the electrode electric field E time trend at each point of the interposing region 4.

The device 1 further comprises, within the interposing region 4, a molecular layer 5 comprising a plurality of molecules 50, each capable of assuming one or more electric states, in a controllable manner, according to a sensed electric field E1.

The above-mentioned dielectric region 40 has a spatially variable dielectric profile, to determine a respective field profile of the electrode electric field E and to spatially modulate the sensed electric field E1 at the molecular layer 5.

The spatial profile of the electrode electric field E depends on the spatially variable dielectric profile of the dielectric region, according to the well-known laws of electromagnetism.

Figure 2:
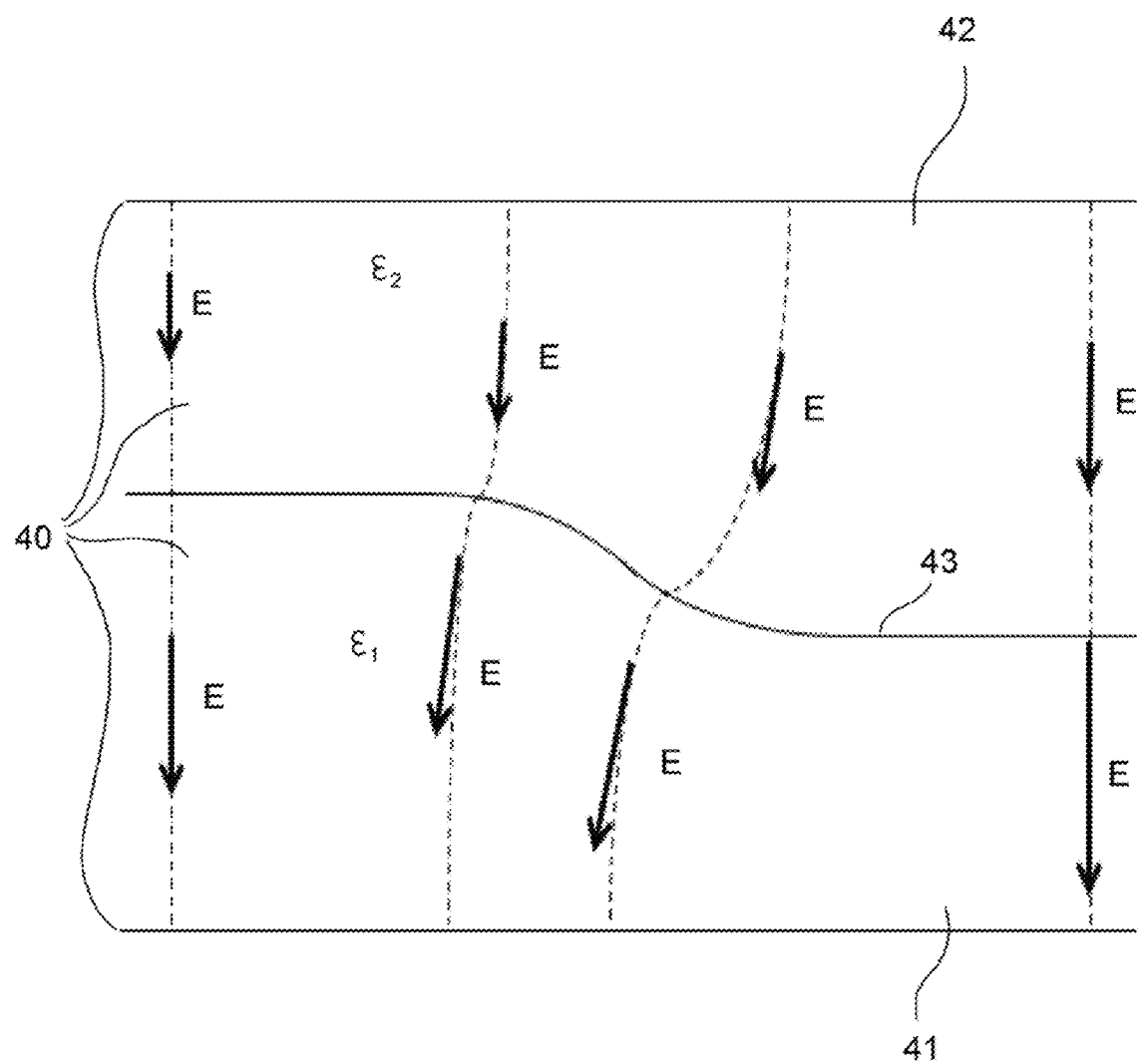
FIG. 2 illustrates a sectional view of a dielectric region comprised in the device, and a spatially variable electric field profile within such a dielectric region.

Further theoretical/mathematical details about the relationship between the variable dielectric profile and the electrode electric field will be given hereinafter in this description. A simplified illustration of such relationships is herein disclosed, with reference to FIG. 2, in which the intensity and direction of the electrode electric field E are shown, in some points of the dielectric region 40, in the case that the spatially variable dielectric profile is obtained by implementing the dielectric region 40 by two dielectric layers 41, 42, having a contact surface 43 (seen as a line 43 in the sectional view of FIG. 2) with a spatially variable profile. In such a manner, a variable thickness (variable from point to point) is defined for each layer, while maintaining constant the total thickness of the dielectric region 40. Moreover, the two dielectric layers are characterized by two respective different dielectric constants, indicated as $\in 1$ and $\in 2$.

It is noticed that the device structure, according to the general concept of the disclosure, is substantially the same in any other section of the same device, for example, a section perpendicular to the development plane of the electrode regions and the molecular layer; while the specific pattern of the variable dielectric profile may vary from section to section, as a function of the design of the specific device to be obtained.

The description set forth above illustrated how the spatial and temporal pattern of the electrode electric field E is defined at each point of the interposing region 4, directly depending on the electrodes.

With reference to the sensed electric field E1, it shall be noticed that it is defined at each point of the molecular layer 5, and it can be seen as a combination of the electrode electric field E, in that point, and a local electric field, due to the electrostatic interactions between molecules, which can therefore be defined as an interaction electric field. Consequently, the sensed electric field E1 at each point of the molecular layer 5 is spatially modulated by the spatially variable electrode field profile E, depending on the spatially variable dielectric profile. In other terms, the sensed electric field E1 at each point of the molecular layer is in turn spatially modulated, in a controlled manner, by the structural conformation of the dielectric region 40.

Figure 3A:
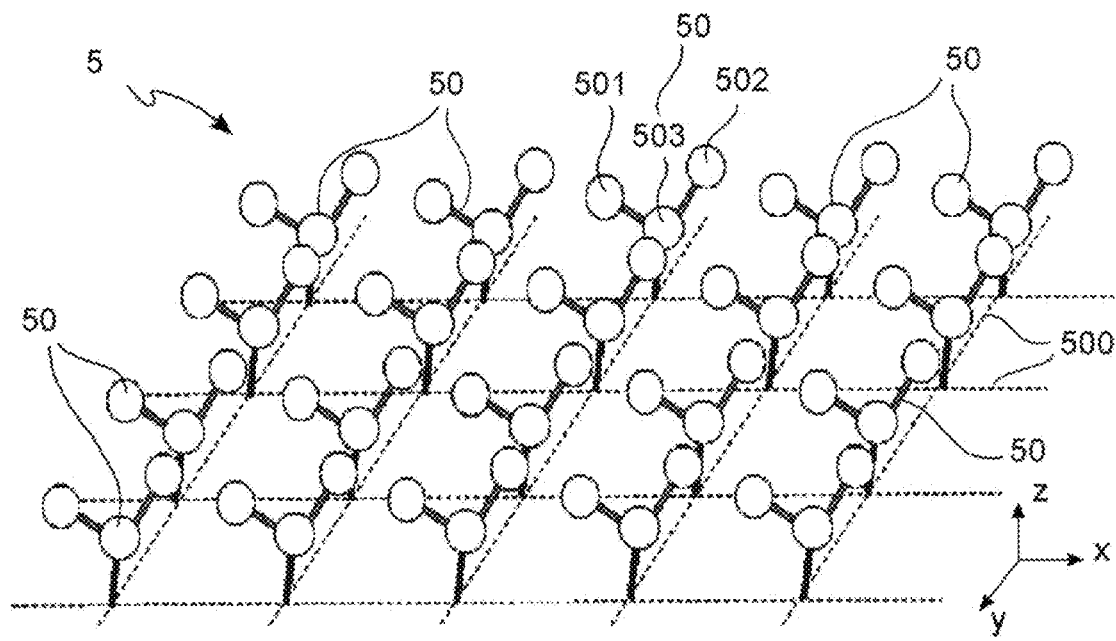
FIGS. 3A and 3B illustrate respectively a perspective view and a top view of a part of a molecular layer comprised in the device.
Figure 3B:
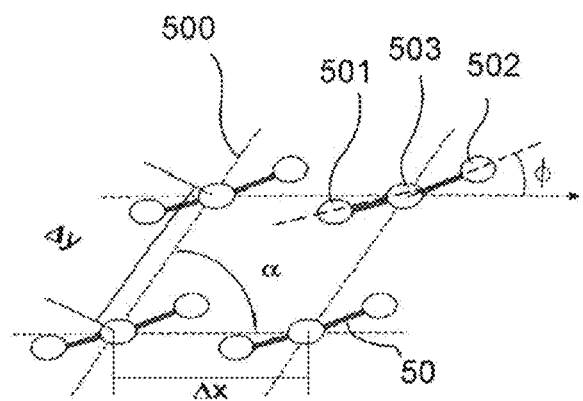
Figure 4:
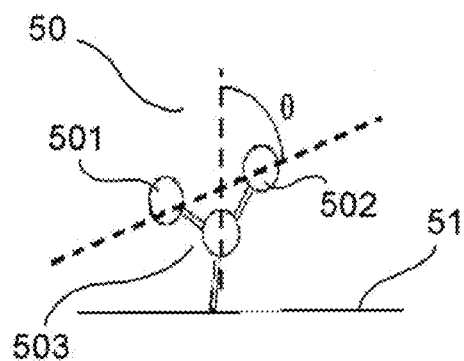
FIG. 4 illustrates a side view of a molecule of the molecular layer.

With reference to FIGS. 3A, 3B, and 4, the molecular layer 5 shall now be considered.

According to an embodiment (schematically illustrated in the perspective view of FIG. 3A), the molecular layer 5 is a planar, or locally planar, molecular layer composed of a plurality of molecules 50 of the same type (each of which being indicated by way of example in FIG. 3A as comprising three atoms or groups of atoms 501, 502, 503, which are mutually bonded), arranged in a substantially regular grid 500 (indicated in FIG. 3A by a hatched line) and having a substantially uniform and stable spatial orientation, with reference to such a grid.

In the embodiment illustrated in FIG. 3A, the molecular layer 5 is a monolayer, having a thickness corresponding to a single molecule.

By planar, or locally planar, molecular layer, is meant herein that the layer mainly extends along the directions designated as x and y, lying in an anchoring plane of the molecules, or substrate, on which the grid is defined. Therefore, the dimension along the dimension z of the molecules, corresponding to the layer "thickness", is negligible compared to the extension of the molecular layer in the directions x and y. In this regard, it shall be noticed that FIG. 3A shows by way of example only a limited sample of the layer that typically, in the device, extends much farther, in the plane x-y.

By a substantially regular grid, it is meant herein that the anchoring points of the molecules, within negligible error margins relative to the molecular dimension, are arranged uniformly to create a geometric grid. In the example illustrated in FIG. 3B (which, as it shall be noticed, is a top view, not a perspective view), the grid has a parallelogram as its base geometric element (at each vertex of which a molecule is anchored) having fixed dimensions $\Delta x$ and $\Delta y$, and a fixed tilt angle $\alpha$ between sides.

Therefore, the grid 500 is characterized by grid parameters $\Delta X$, $\Delta Y$, and $\alpha$.

In other embodiments, the base element of the grid can be different, for example, a rhombus or a square.

The spatial orientation of each of the molecules, with respect to the grid, can be defined by an azimuth angle $\Psi$ (shown in the top view of FIG. 3B), formed by the projection on the plane x-y of the axis connecting the two groups of atoms 501 and 502 and the direction x of the grid; and by a polar angle $\theta$ (shown in the side view of FIG. 4) defined by said axis connecting the two atom groups 501 and 502 and the direction z perpendicular to the plane x-y.

The fact that the spatial orientation of the molecules is stable means that it remains unaltered as the electric field, sensed by the molecules, changes in space and over time, and also means that the molecules are substantially not deformable, even under the action of a variation of their own polarization. Therefore the molecules are selected so that the geometric arrangements due to the rearrangement of the charges, under the action of the sensed electric field, do not significantly alter the molecular geometry.

Referring now to the FIGS. 5A, 5B, and 6, a molecule 50 of the molecular layer 5 according to the disclosure will be described.

According to a preferred embodiment, the molecules 50 of the molecular layer 5 are electrically bistable molecules, having charges that can be confined in a controllable manner, by electrostatic interaction, depending on the sensed electric field E1.

Each molecule is capable of alternatively assuming a neutral state and one or the other of two polarized states, having energy levels different from that of the neutral state, in which each polarized state has a respective polarization of the charges.

According to a notation in use in the QCA field, and adopted herein, the distinction between polarized states and neutral state is based on the effect of a molecule state on the molecules nearby. Particularly, a molecule in a polarized state is such as to electrostatically promote the acquisition, also by the molecules nearby, of a polarized state that is equal or opposite to that of the molecule. Vice versa, the molecule in the neutral state produces substantially no energy unbalance in the polarized states of the molecules nearby, thereby not promoting any. Both the polarized states and the neutral state are associated to configurations of molecular charge. Particularly, the neutral state can be associated to a configuration having clearly separated charges, but in a spatially symmetric manner relative to the molecule and the molecules nearby, or to a configuration with a mobile charge delocalized on the molecule, thus substantially cancelling the polarization and, therefore, the electrostatic effect of the molecule on the molecules nearby.

The ability to assume the two polarized states and the neutral state, and to perform transitions between different states, may occur by virtue of phenomena such as charge confinement and tunneling effect, which allows the charge/charges movement depending on an applied electric field. Typically, in the present disclosure, the applied electric field is the electric field sensed by the molecule, E1. Such a sensed electric field E1 has a vertical component $E1_z$ (in the direction z perpendicular to the molecular layer) substantially coinciding with the electrode electric field E at the molecule, and a horizontal component $E1_{xy}$ (lying in a plane parallel to the plane x-y of the molecular layer) substantially coinciding with the electric field due to a molecular electrostatic interaction between molecules nearby (i.e., within the respective electrostatic interaction ranges).

Figure 5A:
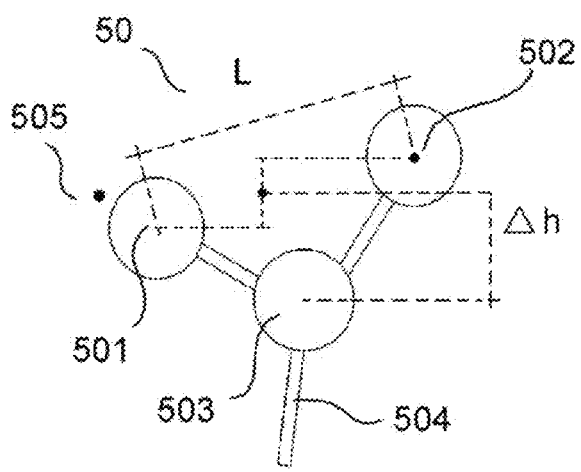
FIGS. 5A and 5B illustrate in a simplified manner a molecule of the molecular layer.

Considering the molecule, the capability to assume the two polarized states and the neutral state is made possible by the fact that the molecule comprises at least one mobile charge and at least one confinement site for each of the states that the molecule may assume: in the example considered herein, and illustrated in FIG. 5A, a first confinement site 501, corresponding to a first polarized state, i.e., one of the two Boolean values (for example, "1"); a second confinement site 502, corresponding to a second polarized state, i.e., to the other one of the two Boolean values (for example, "0"); a third confinement site 503, corresponding to the neutral state, i.e., to the absence of a definite Boolean value.

Figure 5B:
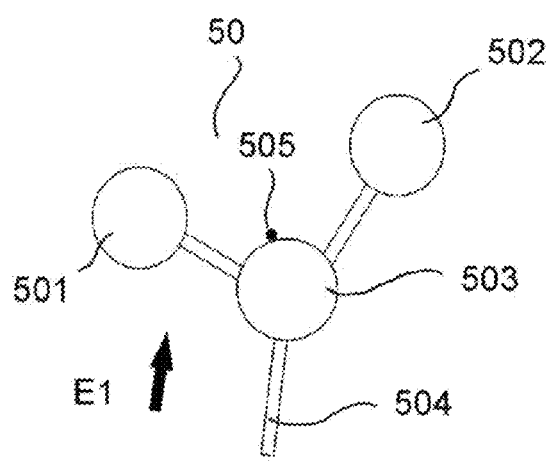

Therefore, considering now for the sake of illustrative simplicity the mobile charge as a localized particle 505, when the mobile charge 505 is at the first confinement site 501 (as shown in FIG. 5A) the molecule is in the polarized Boolean state "1"; when the mobile charge 505 is at the second confinement site 502, the molecule is in the polarized Boolean state "0"; when the mobile charge 505 is at the third confinement site 503 (as shown in FIG. 5B), the molecule is in the neutral state. In more accurate terms, the presence of the mobile charge at a confinement site is a quantum confinement at that site; and the movement of the mobile charge from a site to the other is a redistribution of the charge, for example, associated to a transition of a mobile charge by a tunneling effect.

It is noticed that each confinement site can be composed of a single atom or a group of atoms. Of course, the molecule can comprise further atoms or atomic groups, not shown, provided that they do not affect the properties illustrated above.

Preferably, the confinement sites are in opposite positions within the molecule.

Two further dimensional parameters of the molecule are illustrated in FIG. 5A: distance L between the two confinement sites 502 and 503, which correspond to the two polarized states (L is typically on the order of a nanometer); and height difference $\Delta h$, in the direction z, between the confinement site 503 corresponding to the neutral state and the average height of the confinement sites 501 and 502, corresponding to polarized states ($\Delta h$ is typically on the order of tenths of nanometer, or nanometers).

It is also noticed that the molecule 50 comprises an anchor 504, for example, an anchoring linkage capable of anchoring the molecule to a planar substrate, allowing the formation of the grid described before.

It is further noticed that the molecule according to the disclosure is neutral on the whole. In more accurate terms, a molecule according to the disclosure is a molecule in which it is possible to obtain, in a controlled and time-variable manner, a clear separation of charge (in quantum theory terms), preserving the overall neutrality, due to the presence of a mobile charge balanced out by a fixed opposite charge, or due to the high deformability of the orbitals, by virtue of which the dipole moment may take relevant values and opposite directions depending on the intermolecular field. Known examples of such a molecule are those molecules that are generally neutral, but with a high polarizability (such as those mentioned in "*IEEE Trans. Electron Devices* 2003, vol. 50, No. 9, pp. 1890-1896") in which, as symbolically illustrated in FIG. 6, the electric field can induce a clear separation of charges with opposite signs. In FIG. 6, the quantum charge is shown by two "clouds" 506.

Figure 6:
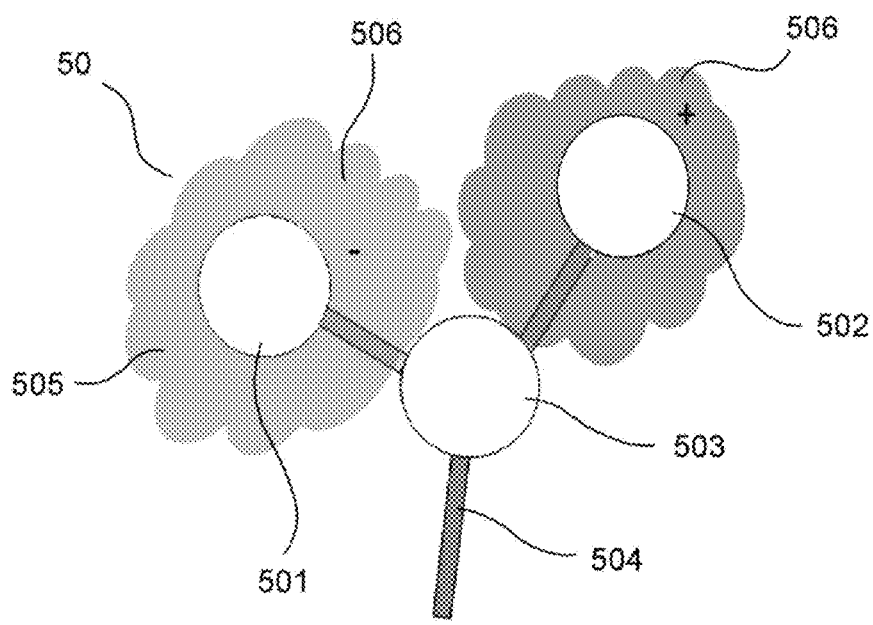
FIG. 6 illustrates a neutral molecule with a high polarizability, i.e., an embodiment of a molecule of the molecular layer.

If by "mobile charge" it is conventionally meant the negative one (i.e., the electron, in terms of a particle), the cloud with the negative sign can be seen as the mobile charge 505, therefore, the molecule of FIG. 6 is in the polarized Boolean state "1".

Based on what has been stated above, it can be understood how the molecules that are needed in the present disclosure can be obtained by using per se known methods: i.e., as molecules having a high polarizability, in a preferred embodiment; or, in another embodiment, as neutral molecules that are charged artificially and provided at the same time with a fixed opposite charge in order to maintain neutrality, which can be obtained, for example, by means of oxidation processes.

Figure 7A:
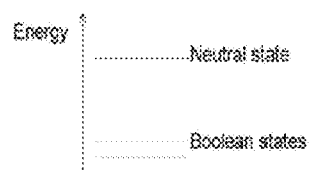
FIGS. 7A-7C illustrate energy diagrams of the states that can be taken by such molecules, according to different implementation examples.
Figure 7B:
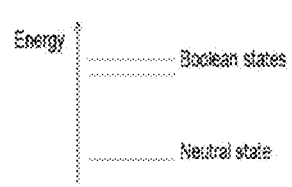
Figure 7C:
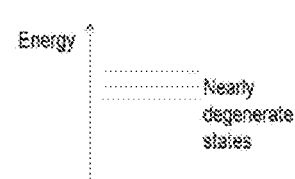

With reference to FIGS. 7A-7C, the energy characteristics of the molecule states will be now illustrated.

First of all, it shall be noticed that, in each of the illustrated examples, the two polarized states are almost iso-energetic, but not exactly iso-energetic. This means that the two polarized states, in a discrete molecule, are separated by an energy difference $\Delta E$, for example, of tens or hundreds meV, which is much less than the difference between their average energy and the energy of the neutral state (a difference that will be indicated as $\Delta U$), and it is also negligible compared to the energy variation that can be induced by the interaction with the molecules nearby, although it is such as to promote a clear charge separation in the discrete molecule at the temperatures at issue, particularly at room temperature. This characteristic is usually present in a molecule of the type described above.

Therefore, in an isolated molecule, the two polarized states comprise a natural polarized state, assumed by the molecule in the absence of interactions, and a polarized state, with a slightly higher energy, which will be defined as "excited".

Figure 8:
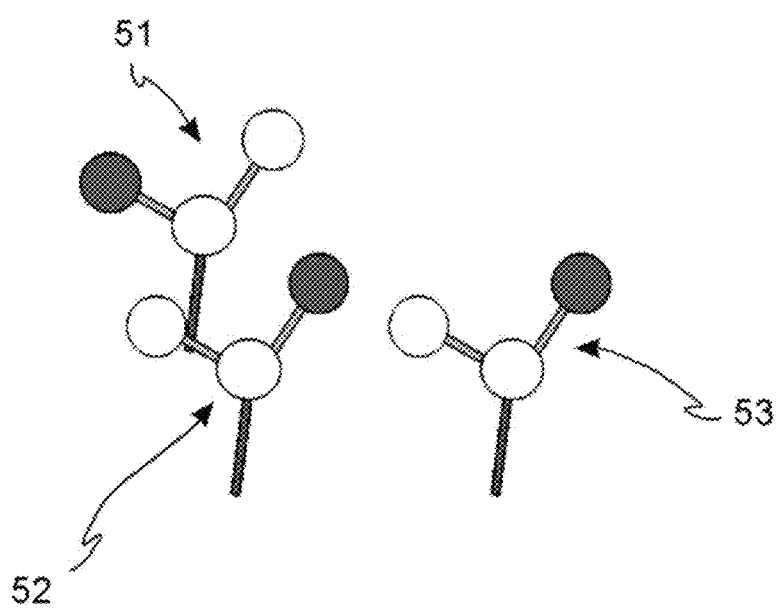
FIG. 8 illustrates an example of polarization assumed by three adjacent molecules.

The geometry of the molecular layer described above, with a suitable selection of parameters, allows the molecules present in the layer, thus, non-isolated, to mutually interact via a normal electrostatic interaction, so that, given a predefined energy difference $\Delta E$ value between polarized states, some of the molecules can be in the natural state and other molecules can be in the excited state; and particularly so that, given one molecule, at least one molecule between the adjacent ones can acquire a polarization state equal to that of the first one. Such a condition is illustrated in FIG. 8, in which the polarization state of three adjacent molecules is illustrated (the relative confinement site in a hatched view), in the case where a polarization alignment exists between molecules 52 and 53, and, on the other hand, in the case where there is a polarization anti-alignment between molecules 51 and 52.

More specifically, the polarization conditions of the molecules of the layer depend on the geometrical parameters of the grid ($\Delta X$, $\Delta Y$ and $\alpha$), on the geometrical parameters of the molecule (distance L between confinement sites, angles $\Psi$ and $\theta$), and on the energy difference $\Delta E$.

A relevant aspect of the disclosure is that the parameters set forth above offer sufficient degrees of freedom to obtain the desired configuration of mutual inter-molecular interaction.

By way of example, a consistent set of values for such parameters, as defined before, is reported in the following Table 1, values that allow obtaining the behavior described above.

TABLE 1

| | | |
|---|---|---|
| ΔX | first dimension of the grid | 1.4 nm |
| ΔY | second dimension of the grid | 1.2 nm |
| α | tilt angle of the grid | 90° |
| Φ | azimuth angle of the molecule | 40° |
| θ | polar angle of the molecule | 80° |
| L | distance between confinement sites in the molecule | 1.0 nm |
| Δh | intra-molecular height difference | 1.5 nm |
| ΔE | energy difference between polarized states, in an isolated molecule | 45 meV |
| ΔU | absolute value difference between "average of the energies of the polarized states" and "neutral state energy", in an isolated molecule | 130 meV |

However, from what has been illustrated above, it is evident that the combinations of values of the above-mentioned parameters that allow obtaining the desired behavior (and that are therefore included in the disclosure) are very numerous. The specific parameters can be defined during the device design stage, by means of per se known numerical simulation methods (such as the "finite element method").

Furthermore, each parameter can be comprised in a range, for example in the neighborhood of the indicated values. By way of example, let us consider typical ranges of values for the variables ΔU and Δh that can be found in molecules usable in the present disclosure: ΔU (as defined in table 1) ranging between 40 and 150 meV; Δh (as defined in table 1) ranging between 0.1 nm and some nm. The suitable combinations of the mentioned variables, within the respective ranges, are then defined taking into account the further condition according to which the maximum intensity of the electrode electric field E, that has to be applied to generate the transitions between molecular states, is in the order of magnitude of $10^6$ and $10^8$ V/m, which is compatible with the need to avoid to reach levels such as to damage the dielectric of the dielectric region.

The acceptable geometric parameters for the grid can be then established according to the exact value that is assumed, within the indicated ranges, by the geometric and energy parameters of the molecule.

FIG. 7A illustrates an embodiment in which the neutral state is characterized by a higher energy level than the energy levels of the polarized states. This implies that the molecule can acquire the neutral state, i.e., it can pass from one of the polarized states to the neutral state, only in the presence of an electric field. Particularly, according to an example of such embodiment, the molecule can acquire the neutral state only if the intensity of the vertical component of the electric field $E_z$ felt by the molecule exceeds a preset intensity threshold $E_{thr}$. As illustrated before, the vertical component of the electric field $E_z$ substantially coincides with the electrode electric field E generated by the electrodes at the same molecule. This implies that, in the device, the transition from and towards the neutral state is controlled by the electrode electric field, as it will be better detailed in the following.

It shall be noticed that the fact that the confinement site 503 corresponding to the neutral state is at a different height compared to the average height of the confinement sites 501, 502 corresponding to the polarized states (i.e., Δh≠0) allows minimizing or nullifying possible second-order effects of the horizontal component of the sensed electric field, due to inter-molecular interaction, on the state transitions from and to the neutral state.

FIG. 7B illustrates an alternative embodiment, in which the neutral state is at a lower energy level compared to the polarized states: in such a case, the electrode electric field is used to determine the transition of the molecule from the neutral state to one of the polarized states, while, in the absence of an electric field, the molecule assumes the neutral state.

FIG. 7C illustrates a further alternative embodiment, in which the three energy states are quasi-degenerate, i.e., they have very similar energy levels. In such a case, the molecule acquires the neutral state or one or the other of the polarized states, in the presence of a vertical electric field, and according to the sign of such a field.

By synthesizing in a per se known manner a type of molecule having the properties indicated above, a molecule operating according to the disclosure can be obtained. Therefore, the disclosure is not limited to the use of a particular molecule. By way of example only, molecules having properties similar to the ideal ones described above are those (belonging to the wider class referred to as "bisferrocenes") comprising two ferrocenes linked to a central part (carbazole) operating as a neutral confinement site, in turn linked to an aliphatic chain operating as an anchor (see, for example, the article "*Towards quantum-dot automata units: thiolate-carbazole linked bisferrocenes*"— Nanoscale 2012, 4, 813).

Moreover, as already noticed, each type of molecule, characterized by the properties described above in detail, can be employed in the molecular layer of the device of the disclosure.

Referring now to the FIGS. 9 to 13, let us consider in more detail the structure of the device 1 according to the disclosure.

In a preferred embodiment (illustrated in the FIGS. 1 and 9), the first and the second electrodes 20, 30 are arranged on two mutually parallel electrode planes; the dielectric region 40 extends between the two electrode planes; the planar molecular layer 5 is substantially parallel to the electrode planes; the molecular layer 5 is arranged between the dielectric region 40 and the first electrode region 2.

The device 1 further comprises a further dielectric region 45 interposed between the molecular layer 5 and the first electrode region 2.

The further dielectric region 45 is provided to move the molecular layer 5 away from the electrode 20, in order to avoid electrostatic shielding effects of the molecular signal due to an excessive proximity to the electrode 20, and in order to allow to spatially modulate the electrode electric field E, thus the electric field sensed by the molecular layer.

According to a further embodiment of the device, also the further dielectric region 45 has a respective further spatially variable dielectric profile. In such a case, the field profile of the sensed electric field at the molecular layer 5 depends on both the dielectric profile of the dielectric region 40 and the further dielectric profile of the further dielectric region 45.

Therefore, according to different preferred embodiments, the molecular layer 5 is interposed between a dielectric region 40 and a further dielectric region 45, at least one of which has a variable dielectric profile.

Figure 9:
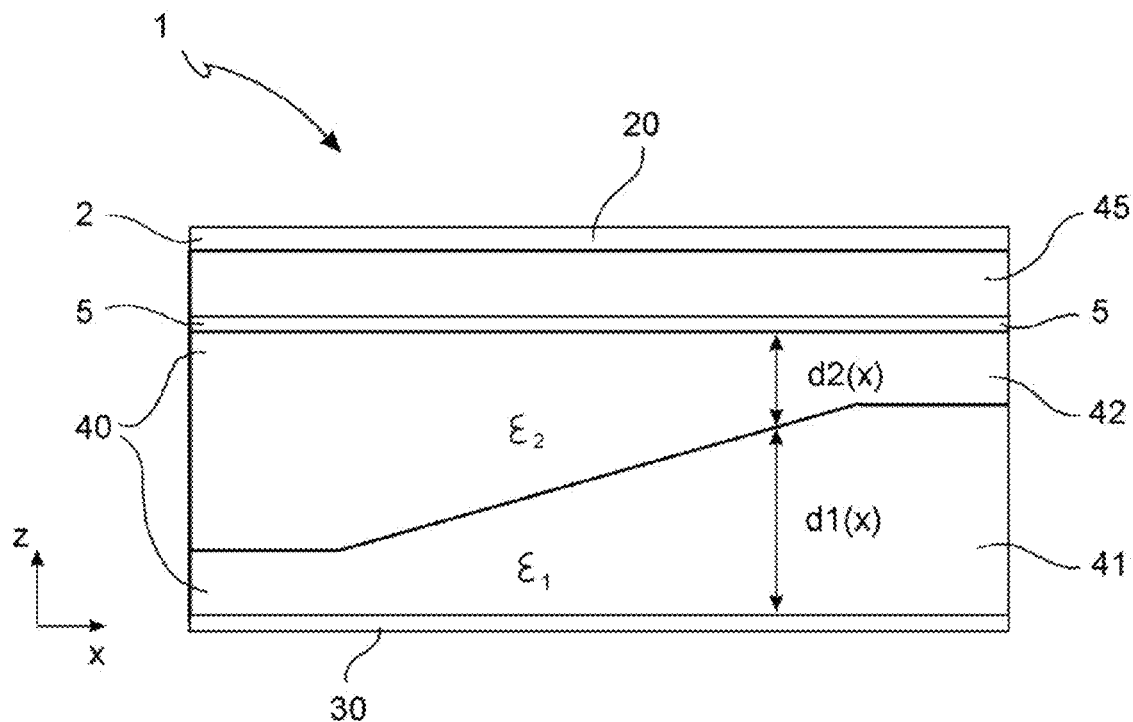
FIGS. 9 to 13 illustrate sectional views of respective implementation examples of parts of the device according to the disclosure.
Figure 10:
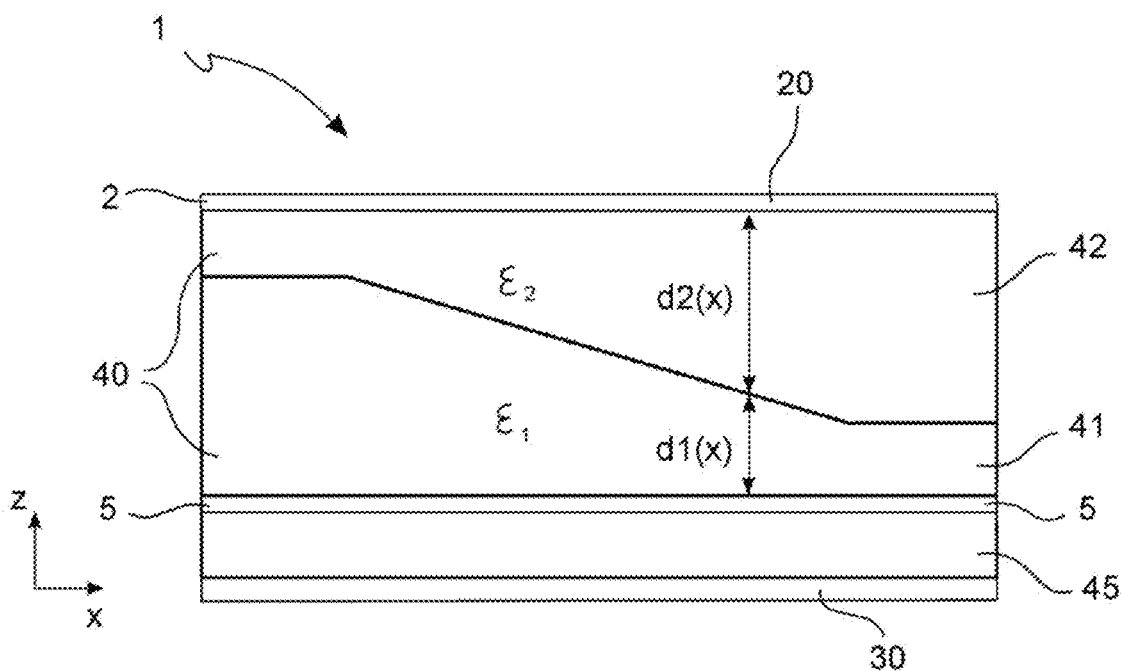

According to an embodiment illustrated in detail in FIGS. 9 and 10, the variable profile dielectric region 40 of the device comprises: a first dielectric layer 41, characterized by a first electric permittivity value ∈1, and having, relative to the direction z perpendicular to the molecular layer 5, a first dielectric thickness d1; and a second dielectric layer 42, overlying the first dielectric layer 41, characterized by a second electric permittivity value ∈2, different from the first electric permittivity value ∈1, and having, relative to the direction z perpendicular to the molecular layer 5, a second dielectric thickness d2.

In such a structure, the first dielectric thickness d1 and the second dielectric thickness d2 are spatially variable (along the direction x and as a function thereof), so as to define the spatially variable dielectric profile; therefore, they are indicated in FIGS. 9 and 10 as $d1(x)$ and $d2(x)$, while the total thickness of the dielectric region $D=d1+d2$ is constant for each x.

It shall be noticed that, in different implementation examples of the disclosure, the number, type, order, and conformation of the dielectric regions and of the dielectric layers can be the most disparate, provided that they define a spatially variable dielectric profile, in the meaning indicated before. Furthermore, although the represented section is along the plane x-z, the variability of the dielectric profile is to be meant as occurring in the whole plane x-y.

FIGS. 9-13 illustrate structures that are provided for in different embodiments of the device.

FIG. 9 illustrates the following type of structure, bottom to top: electrode; dielectric region with two variable profile layers; molecular layer; further dielectric region having constant profile; electrode.

FIG. 10 illustrates the following type of structure, bottom to top: electrode; further dielectric region having constant profile (forming herein a substrate/support for the molecular layer); molecular layer; dielectric region with two variable profile layers; electrode.

Figure 11:
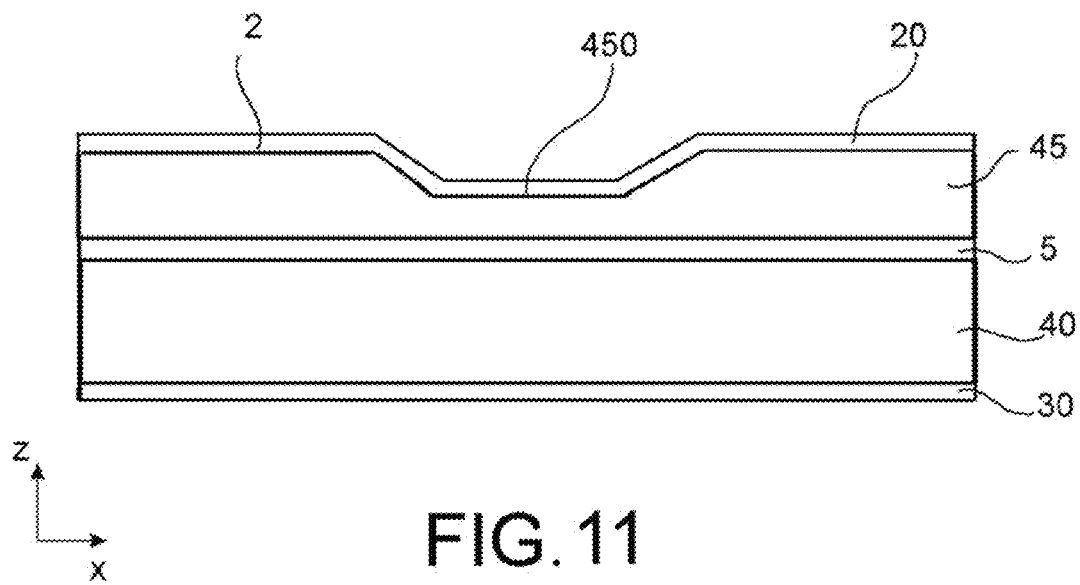

FIG. 11 illustrates a structure in which the dielectric region 40 is monolayered and forms a support for the molecular layer 5, while the further dielectric region 45 is spatially profiled, with a cavity 450 in the upper part thereof, and forms a support for a non-planar electrode region 2 (comprising a non-planar electrode 20 or a plurality of electrodes).

Figure 12:
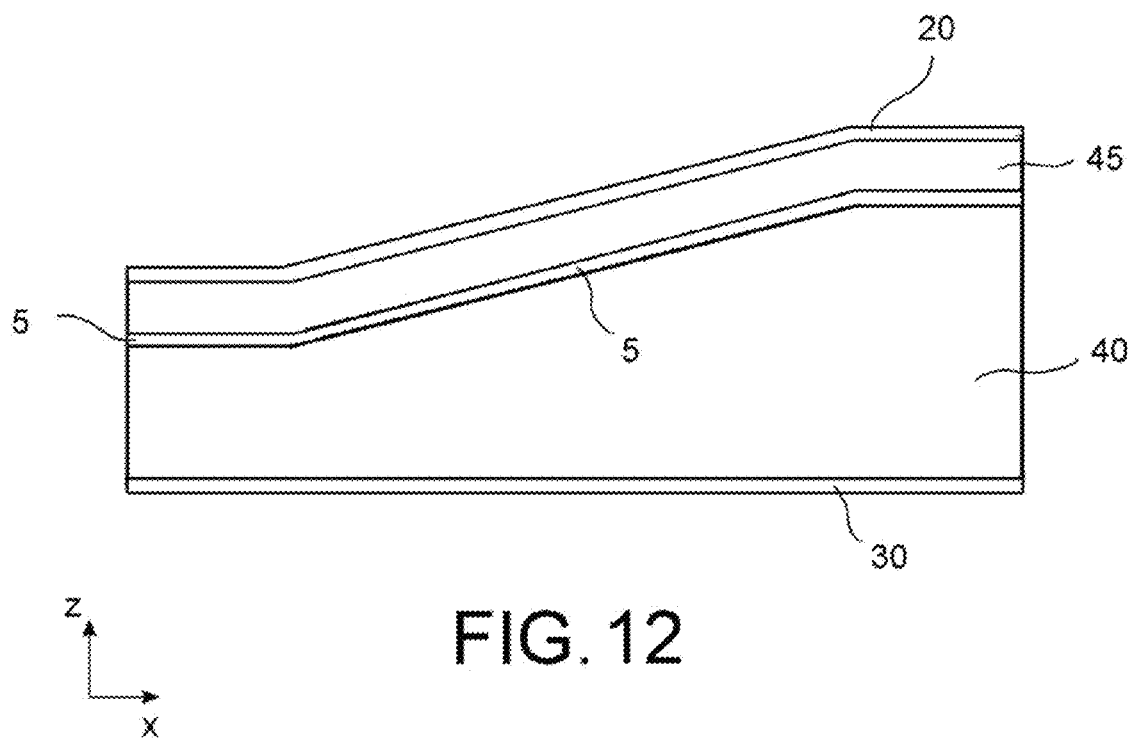

FIG. 12 shows a structure in which both dielectric regions are monolayered and spatially profiled, so that a non-planar molecular layer 5 is interposed therebetween. Therefore, it shall be noticed that in this embodiment the molecular grid is non-planar, although it remains locally planar almost everywhere.

Figure 13:
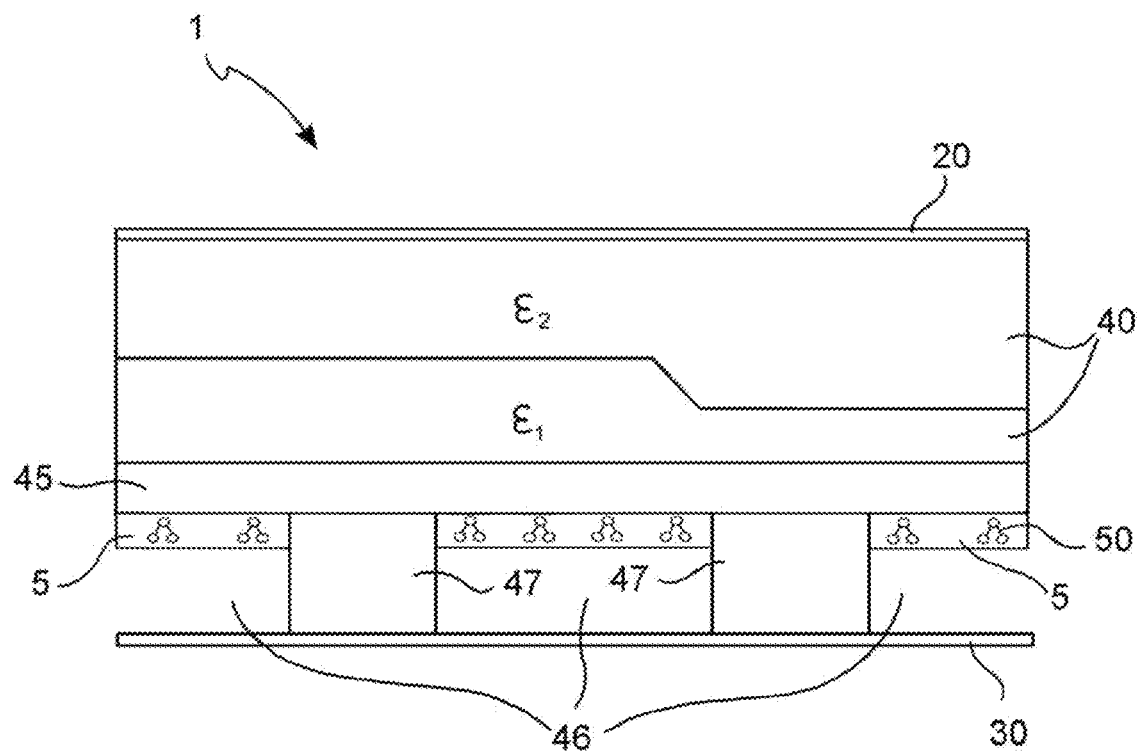

Typically, the dielectric regions 40, 45 are made of a solid dielectric material. However, in an embodiment included in the disclosure, a dielectric region can be an ultra-high vacuum region. One example of such an embodiment is shown in FIG. 13, in which, starting from the bottom of the figure, there are shown: the second electrode 30; an ultra-high vacuum region 46, interposed between the second electrode 30 and the molecular layer 50, which is attached to a solid dielectric substrate 45 that, in turn, is supported by side supports (not shown in the figure) and optionally by dielectric pillars 47; and then, as in other embodiments already illustrated above, a dielectric region 40 with two layers of solid dielectric having spatially variable profile; and the first electrode 20.

Advantageously, the ultra-high vacuum region 46 has excellent dielectric properties, being capable of supporting high electric fields, while nullifying the residual currents through the dielectric stack. Furthermore, in such a case, the molecular layer does not need to be "buried" within the solid dielectric. On the other hand, the implementation of this structure may be more complex compared to the other implementation examples of the device.

It shall be now considered the effect of the dielectric profile on the electric field sensed by the molecular layer.

A possible description of such an effect is based on a schematic diagram of the molecular layer 5 as comprising a plurality of preferably contiguous molecular layer portions, each comprising at least one molecule. It is noticed that reference is made herein to a functional partition of the molecular layer, not to a physical partition (the physical properties of the molecular layer, which is substantially homogeneous and regular, are those described before).

Similarly, the dielectric region comprises a plurality of dielectric portions corresponding to respective molecular layer portions. Each dielectric portion is laterally delimited by a side surface, substantially perpendicular to the molecular layer, and the intersection of which thereto coincides with the perimeter of the corresponding molecular layer portion.

Referring to a structure as previously described, it can be remarked that the sensed electric field in each of the molecular layer portions depends on an effective dielectric constant of the corresponding dielectric portion.

The effective dielectric constant of the dielectric portion, which is variable from portion to portion, depends in turn on the spatially variable dielectric profile of the dielectric region.

For example, referring to the structure of the device 1 as shown in FIG. 9, the effective dielectric constant of a dielectric portion depends on the first electric permittivity value $\in_1$, on the second electric permittivity value $\in_2$, and, furthermore, on the first dielectric thickness d1 and on the second dielectric thickness d2, at the dielectric portion.

The effect of the dielectric profile on the electric field felt by the molecular layer will be described herein below in more detail, with reference to the embodiment of the device illustrated in FIG. 14A. Such a device is similar to that of FIG. 10, except that the molecular layer 5 is not exactly on the interface between the first dielectric layer 41 and the substrate 45, but it is within the first dielectric layer 41, although in an area very close to the substrate 45. Both mentioned embodiments are included in the disclosure.

Figure 14A:
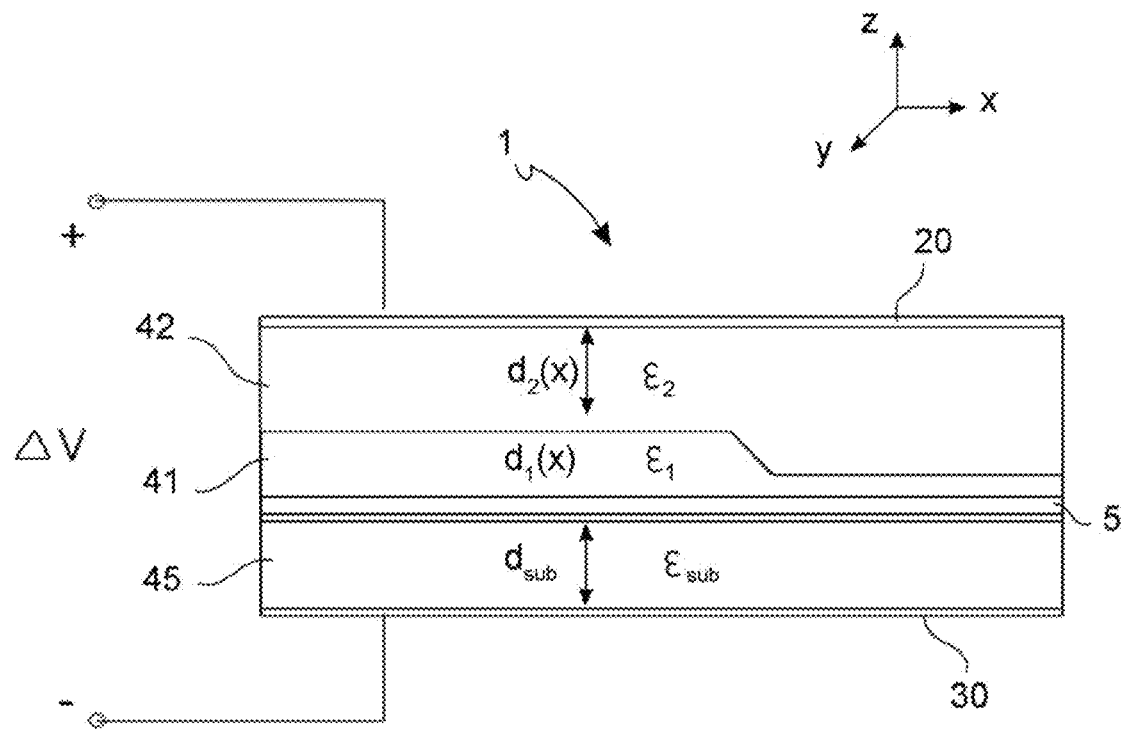
FIGS. 14A and 14B show sectional views of further implementation examples of the device.

The device 1 in FIG. 14A provides for a substrate (or further dielectric region) 45 having a thickness $d_{sub}$ and a dielectric permittivity $\in_{sub}$; a first dielectric layer 41 with a dielectric permittivity $\in_1$, and having a profile determined by a first thickness $d1(x)$, in the direction z perpendicular to the molecular layer, variable along the direction x parallel to the molecular layer; a second dielectric layer 42 with a dielectric permittivity $\in_2$, and having a profile determined by a second thickness $d2(x)$, in said direction z, variable along said direction x.

It shall be noticed that the profile of the second layer is complementary to that of the first layer, this meaning that $d1(x)+d2(x)=D$, where D, for each x, is a value that in this case is constant, equivalent to the total thickness of the dielectric region 40.

Typically, values d1 and d2 are in the order of tens of nanometers, and the whole value D can reach an order of magnitude of 100 nm.

The dielectric material can be, for example, variously doped $SiO_2$, or other types of materials that will be set forth herein below, in the description of the manufacturing method of the device. It is noticed that, herein and in the following formulae, the relative dielectric permittivity values $\in_1$, $\in_2$, $\in_{sub}$ are taken into account, which can be therefore also defined as "dielectric constants".

Figure 14B:
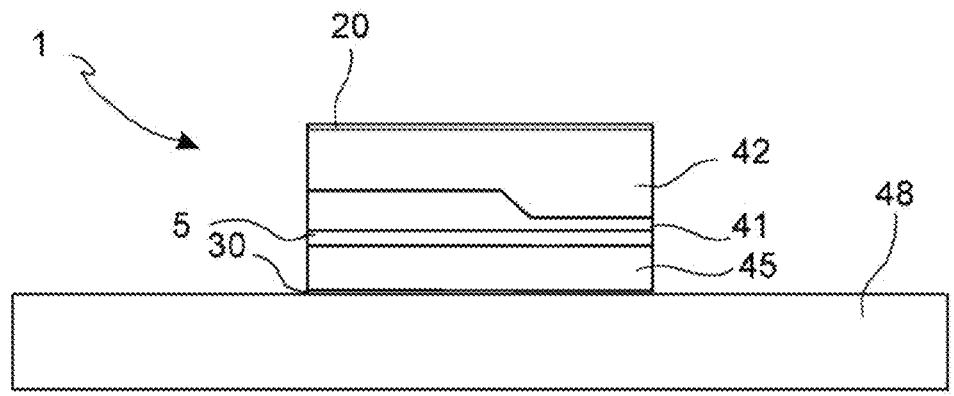

The implementation of such thin layers, as indicated above, is advantageous to allow the generation of a sufficiently high electrode electric field by means of relatively low potential differences. As regards mechanical robustness, however, such thickness values might not be sufficient. Therefore, in a preferred embodiment of the device 1, it is built on a further substrate 48 having a much larger thickness, as shown in FIG. 14B.

Considering the device 1 of FIG. 14A, the electric field can be described at each point of the molecular layer 5 as having a coordinate x, if a concentrated parameters theory is employed, based on an approximation of the dielectric effect as a locally variable planar capacitance. Particularly, it is possible to see with excellent approximation each bidimensional section x-z of the device (as the one shown in FIG. 14A) as a stand-alone system, in which each point (therefore, also the points where the molecular layer is located) is characterized by its own planar capacitance.

Based on such a model, it is possible to obtain the formula governing the relationship between the potential difference $\Delta V$ applied to the electrodes and the intensity of the electrode electric field E, experienced at each point of the molecular layer having coordinate x. By using the parameters of FIG. 14A, as defined above, such a formula is:

$$E(x, t) = \Delta V(t) \frac{[d_1(x)\varepsilon_2\varepsilon_{sub} + d_2(x)\varepsilon_1\varepsilon_{sub} + d_{sub}\varepsilon_1\varepsilon_2]}{d_1(x)\varepsilon_1[d_2(x)\varepsilon_{sub} + d_{sub}\varepsilon_2]} \quad (1)$$

Formula (1) clearly illustrates the relationship between E and $\Delta V$. Consistently with what has been already observed generally, it can be noticed that the time behavior of the electrode electric field E depends on the time behavior of the potential difference $\Delta V$ applied to the electrodes; while the spatial modulation of the electrode electric field E, in the direction x, depends on the values $d_1(x)$ and $d_2(x)$, i.e., it can be carefully controlled via the spatial modulation of the dielectric profile, depending on the variable thickness of the two dielectric layers.

Again, in simplified but more general theoretical terms, it is noticed that the interposing region can be modeled as a capacitor having capacitance $C_m$ (capacitance per area unit of the dielectric layer containing the molecular layer) and as a capacitor having capacitance $C_{nm}$ (capacitance per area unit of all the dielectric layers, upper or lower, which do not contain the molecular layer), arranged in series. Furthermore, the capacitance $C_m$ can be approximated as $\varepsilon_m/d_m$ (where $\varepsilon_m$ and $d_m$ are the dielectric constant and the thickness, respectively, of the dielectric layer containing the molecular layer), while the capacitance $C_{nm}$ can be approximated as $\varepsilon_{nm}/d_{nm}$ (where $\varepsilon_{nm}$ and $d_{nm}$ are the effective dielectric constant and the thickness, respectively, of the set of dielectric layers not containing the molecular layer).

The potential difference $V_m$ through the dielectric layer containing the molecular layer can therefore be expressed as:

$$V_m = \frac{C_{nm}}{C_{nm} + C_m}\Delta V = \frac{\varepsilon_{nm}d_m}{\varepsilon_{nm}d_m + \varepsilon_m d_{nm}}\Delta V \quad (2)$$

Formula (2) suggests some criteria for designing the device.

In order that the dependence effect of the electrode electric field at the molecular layer on the spatial modulation of the dielectric profile remains relevant, the capacitance values $C_m$ and $C_m$ have to be preferably similar, and, in any case, not much dissimilar. In such a case, a similar relationship consequently applies also between the potential differences $V_m$ and $(\Delta V - V_m)$. It shall be noticed that, assuming the relationships indicated above as valid, the magnitude of the electrode electric field at the molecular layer (herein referred to as $E_m$) can be considerably different compared to the magnitude of the electrode electric field that is present in other parts of the dielectric region $E_{nm}$, depending on the difference between the respective dielectric constants $\varepsilon_m$ and $\varepsilon_{nm}$, because, assuming the electrode field as substantially vertical, and approximating the interface between the dielectrics as being locally planar and horizontal, the relationship $\varepsilon_m \cdot E_m = \varepsilon_{nm} \cdot E_{nm}$ applies.

Thus, by suitably selecting the dielectric constants, it is possible to limit the dielectric stress due to possible high intensity fields, at least in part of the dielectric layers.

Figure 15:
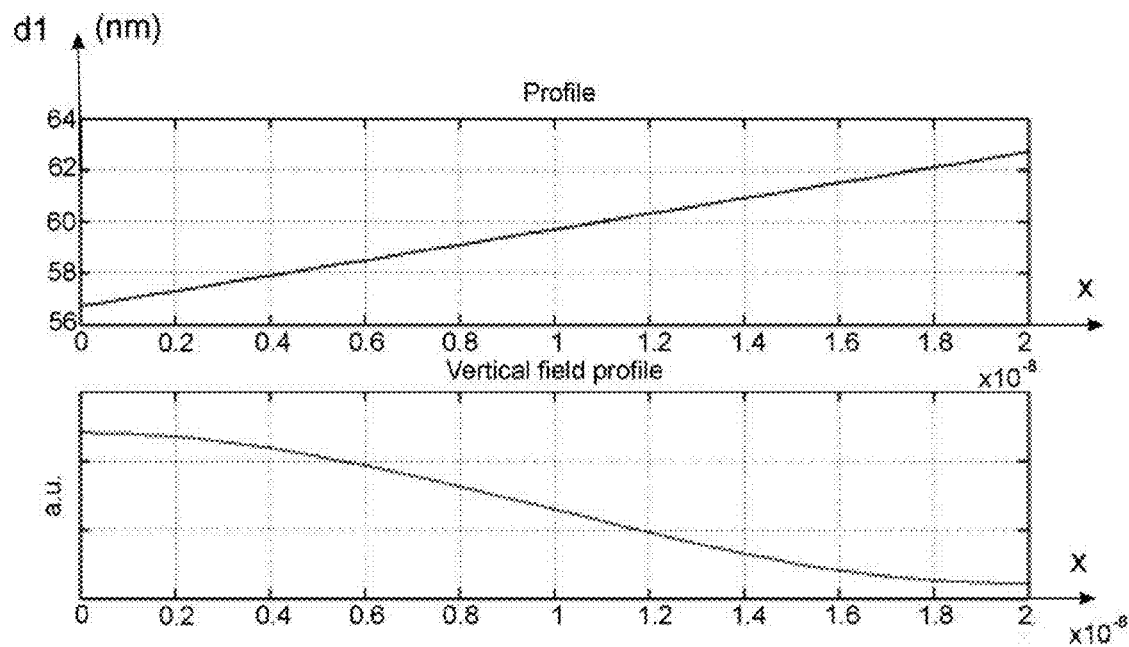
FIG. 15 represents diagrams resulting from simulations of the electric field profile depending on a dielectric profile of the device.

In support of the simplified theoretical explanation set forth above, some more specific results, oriented to the design, resulting from simulations based on finite element computational methods, are herein illustrated, with reference to FIG. 15. Such simulations have been carried out on a device having parameters as the ones already set forth in Table 1, in which the expected value of $\Delta U$ (130 meV) is $5 \cdot k_B \cdot T$ at room temperature T=300 K, and $3.76 \cdot k_B \cdot T_{high}$ for the standard upper operative limit of the integrated circuits $T_{high}$=125° C.

It is considered the general structure of the device shown in FIG. 14A, but having a specific variable profile, reported in detail in the upper diagram of FIG. 15, in which the thickness $d1(x)$ of the first dielectric layer is reported in ordinate in nm, while x varies in abscissa (ranging between 0 and 20 nm).

The total thickness D of the dielectric is 110 nm, from which it is inferred that $d2(x)=110-d1(x)$.

The thickness of the substrate $d_{sub}$ is 30 nm. The relative dielectric constants are respectively 3.9 for the substrate ($SiO_2$ value) and 3 and 50 for the other two dielectrics, in conformity with values set forth in the literature for materials that will be mentioned below.

In the lower diagram of FIG. 15, the resulting intensity profile of the vertical component of the sensed electric field is set forth ("vertical field profile", corresponding to the electrode electric field), which turns out to be spatially modulated as a function of x.

In terms of absolute values, the simulation estimated that the electrode electric field value necessary to bring all the molecules to the neutral state is $E_{max}$=87.3 MV/m (which can be obtained by a maximum potential difference $\Delta V_{max}$=4.975 V); while the electrode electric field value below which all the molecules are in a polarized state is $E_{min}$=85.1 MV/m (which can be obtained through a minimum potential difference $\Delta V_{min}$=4.913 V). The obtained values are included within the desired ranges, as indicated above.

Referring now to the electrode regions, according to an embodiment of the device, the first electrode region can comprise a plurality of first electrodes, and the second electrode region can comprise a plurality of second electrodes, so as to define a plurality of electrode pairs, in which each electrode pair is configured to determine, in a portion of the interposing region that is interposed therebetween, an electric field depending on a respective potential difference applied to the electrode pair.

In accordance with a further embodiment, the plurality of first electrodes is obtained on a first metallization plane, and the plurality of second electrodes is obtained on a second metallization plane.

According to a further embodiment, the first electrode region comprises at least one further metallization plane, on which at least one of the plurality of first electrodes is obtained.

Figure 16:
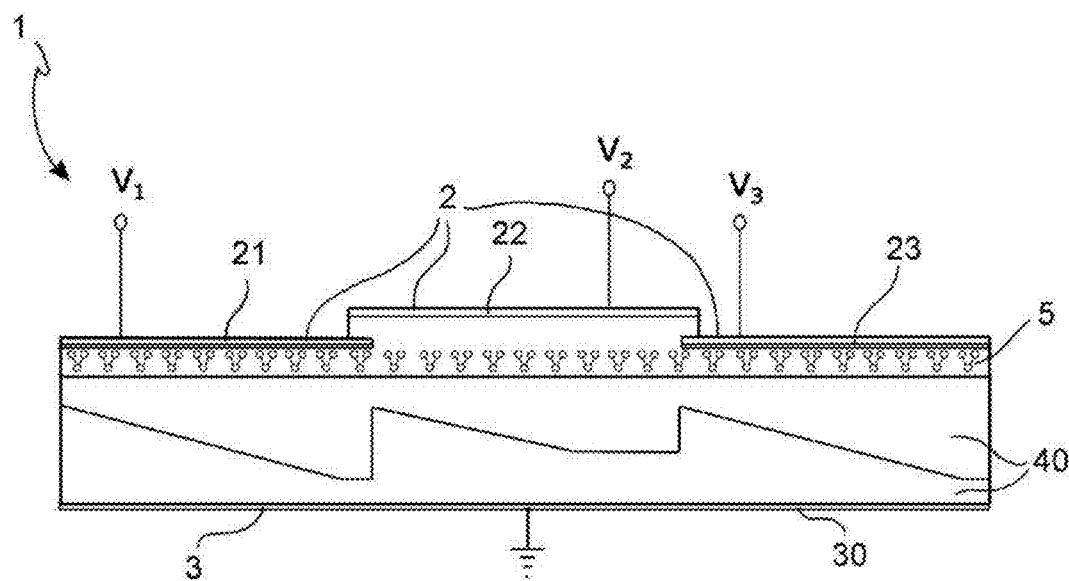
FIG. 16 illustrates a sectional view of a device according to a further embodiment of the present disclosure.

FIG. 16 shows, for example, a device 1 with a second electrode region 3 comprising only one reference electrode 30 (connected to ground), and with a first electrode region 2 comprising three electrodes 21, 22, 23 (two of which being mutually co-planar, and the third one on a different plane), in which the three electrodes are driven by three different potentials, respectively indicated as V1, V2, V3.

Referring now to the potential difference ΔV applied to the electrodes, it is noticed that it typically comprises a DC component (for example, 0 to some tens of Volts) and a time-varying component, according to any trend, having a peak-peak amplitude that typically reaches some Volts, but is sometimes much lower (as reported in the above-mentioned numerical example).

In order to generate the DC component, a battery can be used, with optional voltage multipliers (for example, charge pumps), if necessary to obtain sufficiently high values.

To generate the variable component, controllable variable voltage generators can be used, operating in a preset range of voltage excursion.

The functional aspects of the device according to the disclosure shall be now considered in more detail.

In the device according to the disclosure, information, i.e., the "signal", is coded by the polarization state of a molecule or a group of molecules.

The input-output information flow, and the related processing, are determined by the spatial scheme (or "pattern") of variation of the electric field. Furthermore, in the molecular mono-layer, the type of propagation along a particular direction depends in a decisive manner on geometric and energy parameters, such as the ones already reported in the first column of Table 1.

By "characterized molecules" are meant herein the already polarized molecules, which have already acquired one of the two polarized states; as already noticed, and referring for instance to molecular energy levels as in FIG. 7A, the molecules are in this condition when they are in the presence of an electrode electric field lower than a preset intensity threshold $E_{thr}$.

Furthermore, molecules in the neutral state are defined as "non-characterized molecules", which occurs, as already described, when they are in the presence of an electrode electric field exceeding the intensity threshold $E_{thr}$.

When, due to the variation of the electrode electric field, the molecules of a planar portion of the molecular layer switch from "non-characterized" to "characterized", the polarized state, i.e., the Boolean value, acquired by each of them depends on both the geometry of the molecular layer of that portion, and the state of the already characterized molecules, and the mutual position between the non-characterized and characterized molecules that are adjacent.

The interaction between adjacent molecules in the mono-layer takes place through interaction electric fields (in accordance with the general principle whereby the overall charge configuration always tends to the minimum energy). The interaction electric fields, in the geometry at issue, are mainly horizontal (i.e., having a direction comprised in the plane x-y coincident with or parallel to the molecular layer); therefore, they are distinct from the electrode electric field, which is vertical, the effect of which has been described above.

Figure 17:
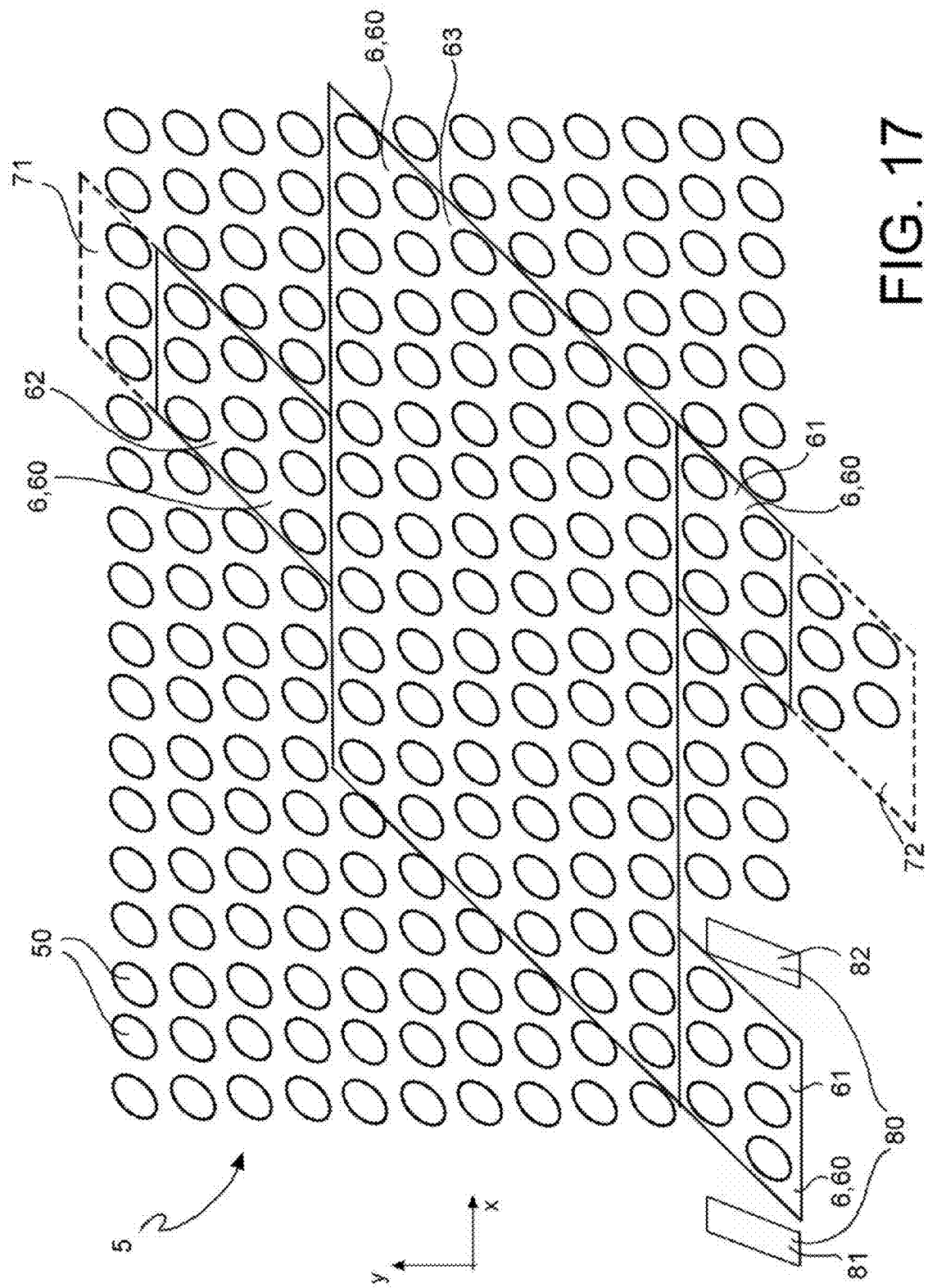
FIG. 17 represents a top view of the molecular layer, in which a functional unit of the device is highlighted.

FIG. 17 illustrates a preferred embodiment of the device; it represents a top view (not perspective view) of the molecular layer 5 of the device, in which each molecule is represented by sake of simplicity as an ellipse (inclined, to schematically indicate the tilt azimuth angle). The same illustration conventions will be adopted in the subsequent FIGS. 21 and 22A-D.

The molecules 50 of the molecular layer 5, illustrated in FIG. 17, are logically grouped to form functional units 6; each functional unit 6 comprises a planar portion 60 of the molecular layer, i.e., a uniform portion made of molecules of the same type; furthermore, each functional unit 6 is configured to implement a digital function.

Therefore, from this point of view, the device 1 can correspond to a logic gate or to a network of logic gates comprising a plurality of mutually inter-operating logic gates.

The digital function performed by the functional unit 6 depends first of all on the electrostatic interaction between the molecules of the functional unit and the mutual orientation and/or position of the molecules themselves.

In accordance with an embodiment, the planar portion 60 of the functional unit 6 comprises one or more input portions 61, one or more processing portions 63, one or more output portions 62.

Each input portion 61 comprises one or more input molecules, sensitive to one or more input signals. An input signal can be an electric field of interaction (typically horizontal, in the plane x-y) generated by other molecules, for example belonging to the output portion 72 (dashed in FIG. 17) of another functional unit.

Alternatively, an input signal can be an input external electric field, also typically horizontal, in the plane x-y. Such a field is defined as external, since it is not generated by the molecular layer. In this regard, an embodiment of the device provides that the device further comprises at least one input element 80, configured to generate the one or more input signals, based on an external control input for controlling the logic gate.

In accordance with an implementation example, illustrated in FIG. 16, the input element 80 comprises at least one pair of input electrodes 81, 82, arranged on the same planar substrate of the molecular layer (in the plane x-y), configured to generate the input external electric field, having a substantially horizontal direction, i.e., parallel to the molecular layer.

Each output portion 62 comprises one or more output molecules, which are sensitive to the interaction with the molecules of the input portion or to the interaction with the molecules of the processing portion 63. The output molecules, in turn, are suitable to affect one or more output signals of the functional unit, which depend on the input signals and the electrostatic interactions between the molecules of the functional unit.

An output signal can be an electric interaction field (typically horizontal, in the plane x-y), affecting the polarization state of molecules of an input portion 71 (dashed in FIG. 17) of another functional unit.

Alternatively, an output signal can be an electric interaction field that is detected and conveyed outwards to the device, in the same way as an output of a conventional logic gate, by optionally interposing an electronic device per se known for the adaptation of the respective signals.

In this regard, an embodiment of the device provides that it further comprises at least one output element 90, configured to detect the polarization state of the output molecules and to generate the one or more output signals.

Figure 18:
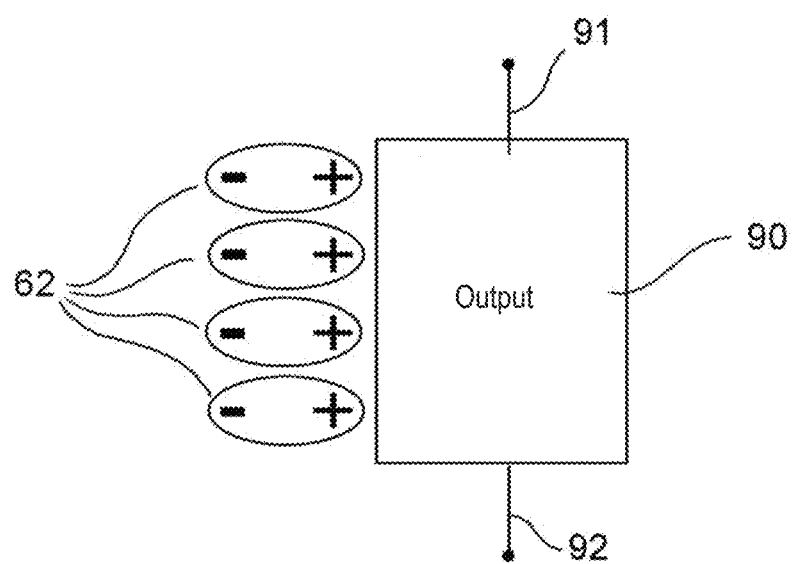
FIG. 18 shows an output signal element of the device, seen from above.

In accordance with an implementation example, illustrated in FIG. 18, the output element is a miniaturized electrometer 90, arranged on the same planar substrate of the molecular layer 5. Such an electrometer is sensitive to the polarization of the output portion 62 of the functional unit of the device, and it is configured to generate the one or more output signals, for example, a potential difference between the output terminals 91, 92. Particularly, the electrometer 90 can be sensitive to the dipole orientation, therefore to the charge position within the group of output molecules of the output portion 62. According to a particular example, such a miniaturized electrometer can be a Single Electron Transistor (SET).

Based on what has been stated above, it can be noticed that, according to an embodiment of a functional unit 6 of the device 1, the one or more input signals and the electrode electric field E, generated by the electrode regions, cooperate to determine the polarization state of each of the molecules of the input portion 61; then, the determined polarization state of the molecules of the input portion 61 and the electrode electric field E cooperate to determine the polarization state of each of the molecules of the processing portion 63; then, the determined polarization state of the molecules of the processing portion 63 and the electrode electric field E cooperate to determine the polarization state of each of the molecules of the output portion 62; finally, the determined polarization state of the molecules of the output portion 62 determines the one or more output signals of the functional unit 6, in turn directed outwards of the device or to another functional unit of the same device.

The contribution of the electrode electric field E is to force the molecules to the neutral state (at those points where the field intensity exceeds a threshold $E_{thr}$) or to allow the molecules to assume a polarized state (at those points where the field intensity is below a threshold $E_{thr}$). In other terms, by means of the spatially modulated electrode electric field E, it is possible to select which molecules of the functional unit are "characterized" and which are "non-characterized". It shall be apparent that this applies also for reset operations on molecules that, in previous operative conditions, were "characterized", and which have to go back to the "non-characterized" state before acquiring a new state in a new operative condition.

Therefore, in this implementation example, the state change of a molecule, from one to the other of the two polarized states, occurs through a transition from an initial polarized state to the neutral state, depending on the electrode field, and through a further transition from the neutral state to the other polarized state, depending on the interaction field, i.e., the electrostatic interactions with other molecules of the functional unit.

Figure 19:
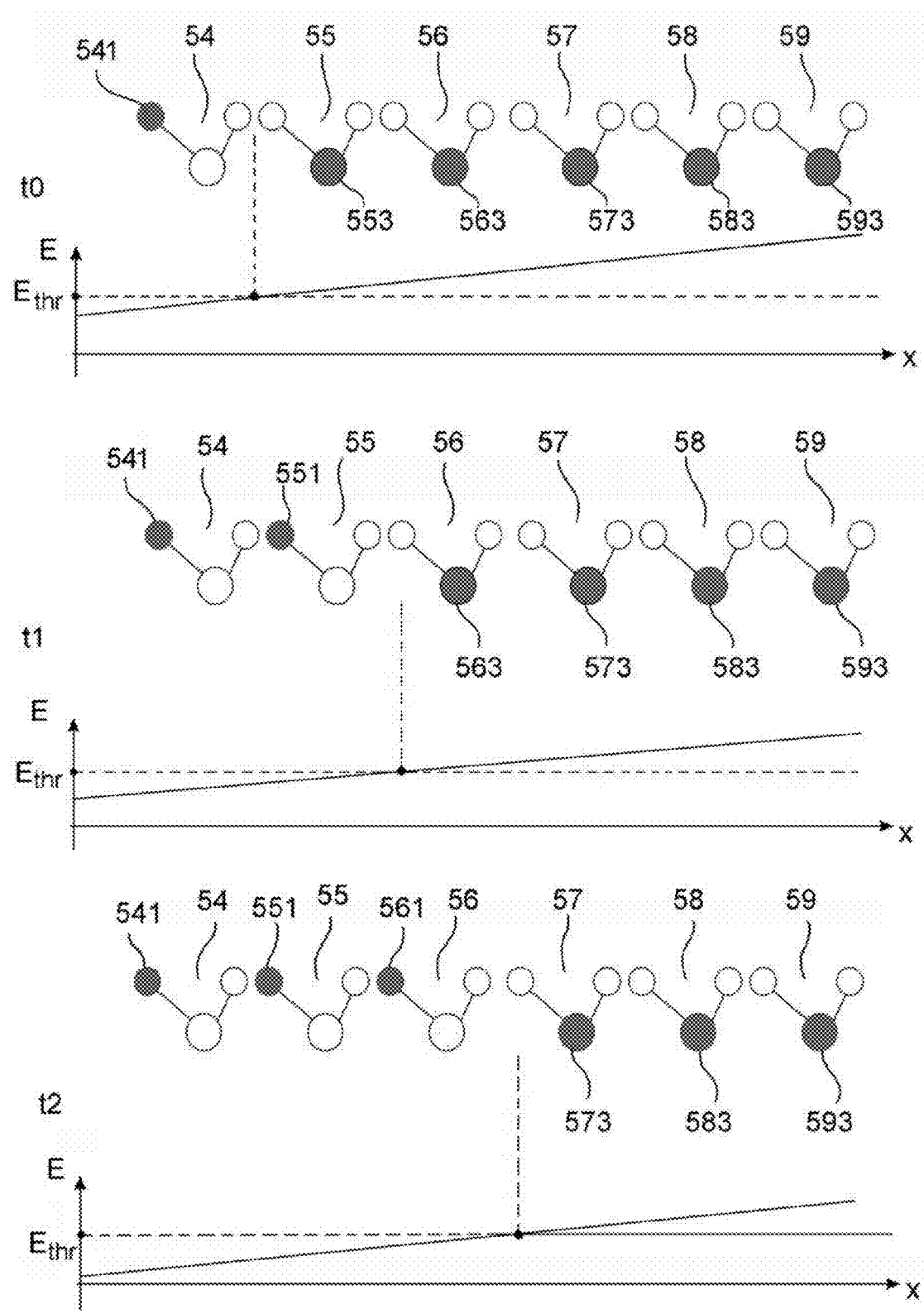
FIG. 19 represents a spatial and time diagram of the evolution of an electrode electric field, and the respective effect on the molecules of the molecular layer.

FIG. 19 shows an example of space-time evolution of the operative mode described above. For each of three instants t0, t1, t2, the polarization state is shown for some molecules, linearly adjacent along the axis x; in addition, the electrode electric field intensity is also shown, at such molecules, which is spatially modulated in the direction x. It is supposed herein that the spatial modulation of the dielectric profile, at the molecules 54-59, is such that the electrode electric field E intensity, at each given instant, for a given potential difference ΔV, linearly increases from the left to the right in the direction x. Consider then the case when it is imposed to the potential difference ΔV applied to the electrodes to decrease in time, starting from t0. This is shown in FIG. 19 by a shift towards lower values of the entire straight line representing the intensity of the electrode electric field as a function of the space (in the direction x), as going over time from the instant t0 to t1, to t2.

At the instant t0, the molecule 54 assumes a polarized state, for example, the natural state (indicated by the confinement site 541, hatched), because, at such a molecule 54, the electrode electric field intensity is below the threshold $E_{thr}$. On the other hand, at the other molecules 55-59, the electrode electric field intensity exceeds the threshold $E_{thr}$; thus, the molecules 55-59 are kept by such a field in their own neutral state (conventionally represented by the respective neutral confinement sites 553-593, hatched) and the polarized state of the molecule 54 cannot propagate to the other molecules.

At the instant t1, the electrode electric field assumes a value below the threshold $E_{thr}$ also at the molecule 55, which, being not forced to the neutral state anymore, experiences a transition towards a polarized state (confinement site 551, hatched), due to the electrostatic interaction with the molecule 54. The other molecules 56-59 remain in the neutral state.

Similarly, at the instant t2, the electrode electric field assumes a value below the threshold $E_{thr}$ also at the molecule 56, which, being not forced to the neutral state anymore, experiences a transition towards a polarized state (confinement site 561, hatched), due to the electrostatic interaction with the molecule 55. The other molecules 57-59 remain in the neutral state.

This explanation can be repeated to illustrate the behavior also in subsequent instants.

The example described above shows how the state transition of the molecules is controlled by varying the potential difference applied to the electrodes of the device over time, while the type of evolution that is obtained, thus the operation performed by the functional unit, can be pre-set through a spatial modulation of the electrode electric field, which is obtained, in turn, by modulating the dielectric profile at the different points of the molecular layer.

Therefore, in the present disclosure, a correlation between the spatial modulation of the profile of the dielectric region of the device and the functionality of the various parts of the molecular layer of the same device is established. Each part of the molecular layer, which is per se uniform, becomes a functional unit, with a specific function, according to the spatial modulation of the dielectric profile that is present (according to the embodiment) above and/or below it.

In order to better illustrate the aspects related to the "spatial modulation of the dielectric profile", consider the particular embodiment of the device, according to which the dielectric region is composed of a first and a second dielectric layers. The first dielectric layer is etched in a controlled manner, i.e., a plurality of cavities and/or engravings is obtained on a surface (for example, an upper surface) of such a layer. In principle, shape, dimensions and positions of the cavities can be any; for each specific case, they are obtained in accordance with a predefined design to obtain a specific profile for the dielectric region and, consequently, a specific function of the functional unit on the corresponding portion of the molecular layer.

The second dielectric layer has a surface, for example a lower surface, exactly corresponding and complementary to the upper surface of the first dielectric layer, so that, when the two dielectric layers are placed one over the other, in direct contact to one another, the second dielectric layer fills all the cavities and/or engravings of the first dielectric layer, and has a flat surface on the other side, which, for example, acts as a support for the molecular layer.

The above-described embodiment implements devices that, as seen in section, may correspond, for example, to FIGS. 1, 9, 10, 13, 14A, 14B, 16.

Figure 20A:
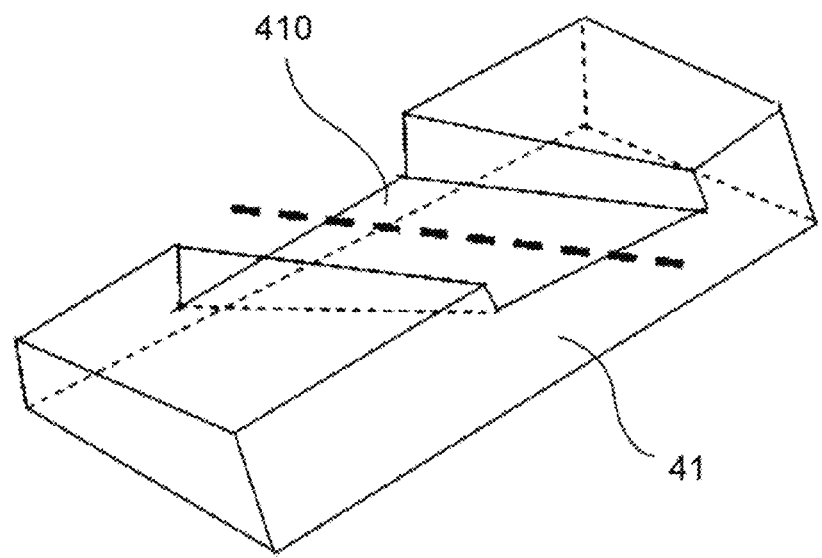
FIGS. 20A and 20B illustrate respective implementation examples of a dielectric layer belonging to the dielectric region of the device.
Figure 20B:
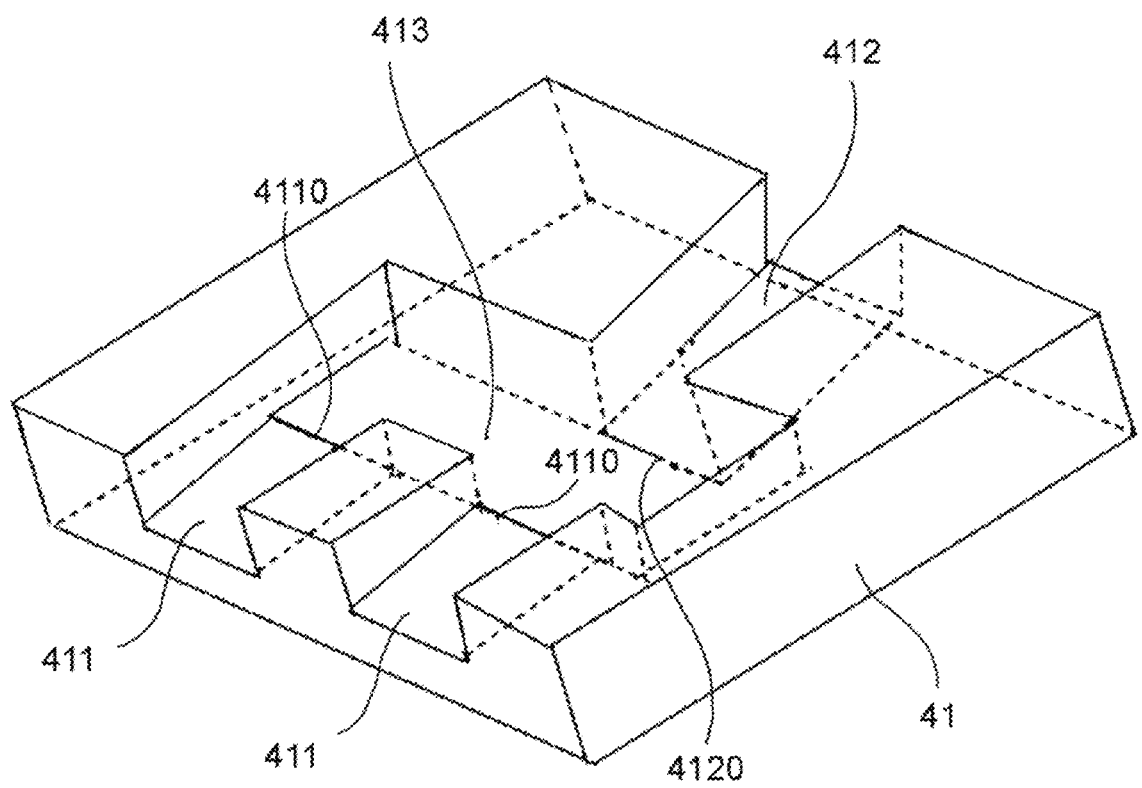

Examples of portions of the first dielectric layer according to such an embodiment are illustrated in the FIGS. 20A and 20B.

The portion of first dielectric layer 41 shown in FIG. 20A has a cavity 410 formed by an engraving of controlled dimensions, and in particular having a variable depth according to a constant slope along a direction highlighted by a dashed line. Such a portion of dielectric layer 41, as seen in section, leads to a linearly variable dielectric profile such as the one illustrated, for example, by the upper diagram of FIG. 15.

The portion of first dielectric layer 41 shown in FIG. 20B has a more complex cavity, obtained by a plurality of engravings: a first engraving 413 (central, in the figure) having a constant depth, with a first depth value, so as to generate a flat-bottomed cavity portion, for example, having a rectangular shape; a second engraving 412, adjacent to the first engraving 413 at a perimeter span 4120 of said rectangular bottom of the first engraving, extending along a transversal direction with respect to the first engraving, and having a variable depth, with a constant slope, from said first depth value to a second depth value smaller than the first depth value; a pair of third engravings 411, adjacent to the first engraving 413 in respective spans 4110 of a side of the rectangular bottom opposite to the side from which the second engravings 412 extends; each of the third engravings 411 extends along a direction transversal with respect to the first engraving 413, on the opposite side thereof relative to the second engraving 412; furthermore, each of the third engravings 411 has a variable depth according to a further constant slope, from said first depth value up to a respective third depth value, higher than the first depth value.

It shall be noticed that, by combining a first dielectric 41 having geometric characteristics similar to those of FIG. 20B, and a second dielectric 42, having a lower surface complementary to the engraved upper surface of the first dielectric, a dielectric region 40 is obtained, which is capable of defining, on a molecular layer located above or under it, a functional unit such as the one described in FIG. 17, where the third engravings 411 are above or under the input portions 61, the first indentation 413 is above or under the processing portion 63, the second indentation 412 is above or under the output portion 62.

Taking into account such a correspondence, an input-output direction in FIG. 20B can be identified, along which the engraving slope is "upward" in the first span (third "input" engravings 411), then "flat" in the middle part (first "processing" engraving 413), finally, again "upward" in the last span (second "output" engraving 412).

Referring now to the functions that can be implemented by the device described above, they relate to all of the main categories of digital operations on a signal: storing, propagation along a direction, and processing of one or more inputs to get an output.

Correspondingly, the functional units of the device, described above, are capable of performing a plurality of logic functions, among which, by way of non-limiting example, one or a combination of functions of the following group: memory cell, binary line, logic gate NOT or inverter, logic gate AND, logic gate OR, logic gate NAND, logic gate NOR.

As already described, the implementation of one or another of the functions depends on a selection of the space-temporal variation pattern of the electric field applied to the device (i.e., the electrode electric field).

The function as a memory cell, suitable to store a value "0" or "1", is evident, if each logic value is associated to a respective one of the two polarization states of each molecule.

The function as a binary line, suitable to transfer in a controlled manner a logic value on cells (or molecules, or groups of adjacent molecules), can be obtained by suitably driving the potential difference applied to the electrodes in devices that, as seen in section, have a dielectric region having a linearly variable boundary, with a constant or variable slope, in a predefined manner. This corresponds to devices in which the first dielectric layer is engraved as illustrated before with reference to FIG. 20A. The space-time evolution of the electrode electric field E and of the polarization of the molecules, in such a case, is the one exemplified above with reference to FIG. 19.

Figure 21:
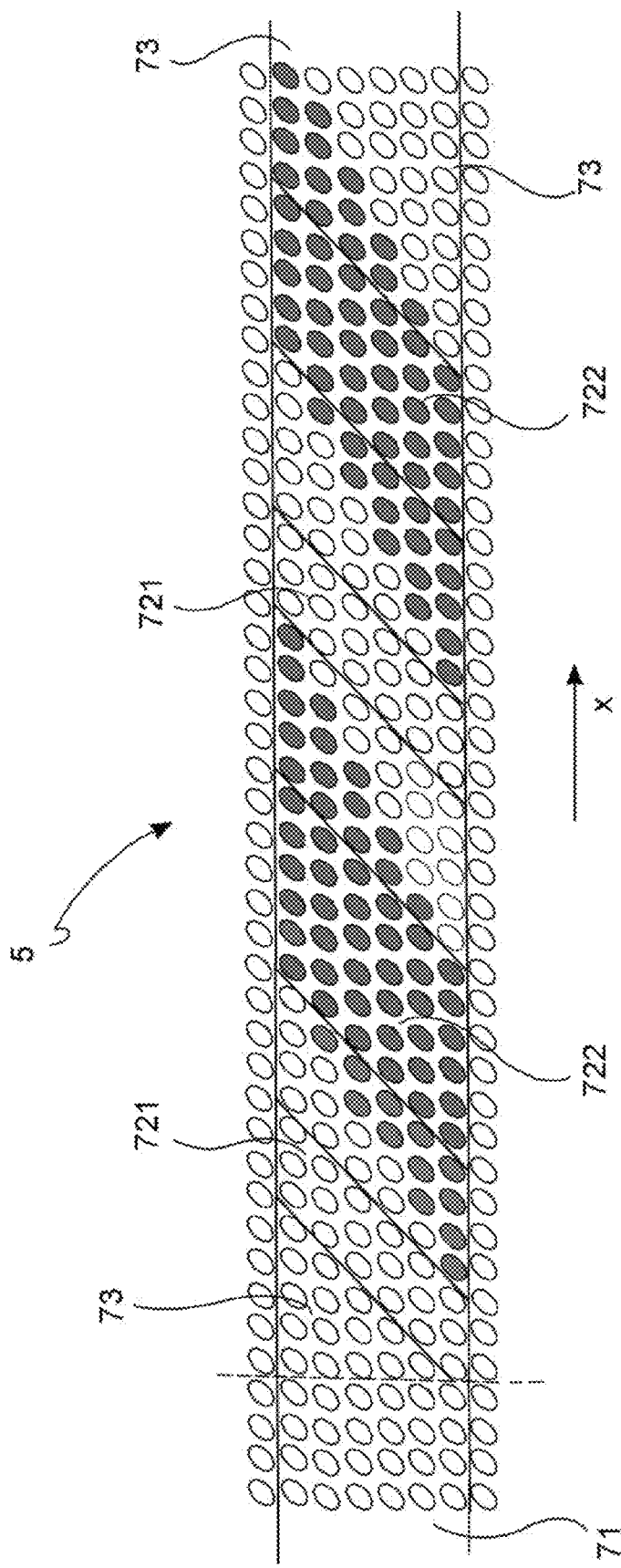
FIG. 21 represents a top view of a molecular layer portion configured to implement a binary line.

Starting then from a binary line as that described above, by suitably setting the mutual orientation between the molecules of a particular group, and by suitably determining the electrode field, as illustrated above, the polarization state of a series of adjacent molecules may be changed periodically in space, as shown in FIG. 21. The molecular layer 5 of FIG. 21 is characterized by the parameters reported in Table 1, except for the energy difference between the polarized states, which is set as 15 meV in this example (on the other hand, it shall be noticed that it is possible to obtain a binary line with the properties herein described also in a molecular layer with $\Delta E$ equal to the one of Table 1, by varying other geometric parameters of the grid). The geometry of the underlying dielectric has a profile linearly variable along the direction x, which is also the direction of information propagation. The molecular layer 5 has an input portion, indicated by 71, formed by molecules on which a polarization state is imposed, corresponding to a Boolean state (for example "0"—conventionally indicated in white). The molecular layer 5 further comprises a signal transport portion (or binary line) 73. The signal propagation in the binary line, along the direction x, from the left to the right, occurs as illustrated before in FIG. 19. In this case, however, the slope of the dielectric profile and the interaction of the molecules are such as to periodically determine a polarization alignment and anti-alignment. Consequently, after that the electrode electric field decrease allows the molecules getting out from the neutral state, the portions 721 of the binary line have molecules with a polarization (Boolean state "0") aligned to that of the input portion, while the portions 722 of the binary line have molecules (hatched in the figure) with an anti-aligned polarization (Boolean state "1").

Thus, on the basis of the same principle, this allows transporting along the molecular layer, and providing in known positions, both a logic value and its opposite.

For example, by arranging on the molecular layer the output portions adjacent to the anti-alignment portions 722, an inverter function can be obtained.

As regards logic gate functions, an exemplary universal logic gate NAND and/or NOR is herein illustrated.

Consider a functional unit such as that described in FIG. 17, obtained on a molecular layer characterized by parameters such as the ones reported in Table 1. The dielectric profile is determined by a first dielectric profile, engraved as shown in FIG. 20B, and the relationship between dielectric profile and portions of the functional unit has been already illustrated in the description of FIG. 20B.

The fact that the processing portion 63 corresponds to an area where the dielectric profile is flat (first engraving 413) implies that all the molecules in that area simultaneously relax, abandoning their neutral state, when the electrode electric field falls below the threshold $E_{thr}$.

The polarization state at which each molecule reaches stability depends on the characteristics of the molecular layer, but also on boundary conditions, which comprise the value of the electrostatic signals of the input portions, the position of the boundaries between the input portions and the processing portion, the shape and dimensions of the processing portion, and the geometric orientation of the processing portion (depending on the geometric characteristics of the corresponding engraving/cavity in the first dielectric layer) relative to the orientation of the molecules.

FIGS. 22A to 22D schematically illustrate the results of simulations carried out for the several possible input combinations. Conventionally, those molecules having the first (natural) polarization state are indicated in black, and those molecules having the second (excited) polarization state are indicated in white in all the figures.

In the time evolution of the logic gate operation, the molecules of the input portions are polarized firstly, depending on the input signals; then simultaneously, the molecules of the processing portion are polarized; then, the molecules of the output portion are polarized, depending on the resulting polarization pattern in the processing portion.

Figure 22A:
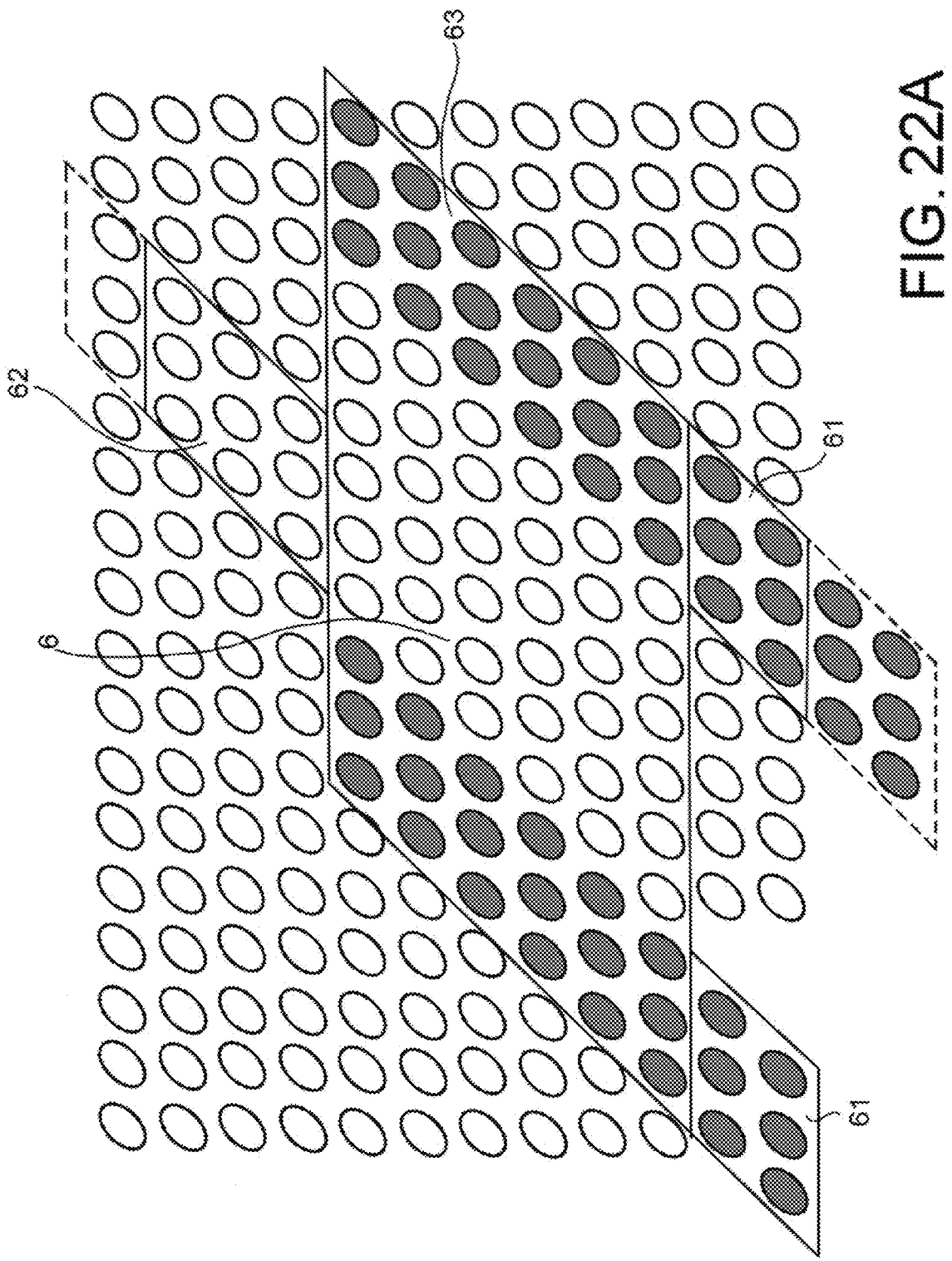
FIGS. 22A to 22D represent top views of four operative conditions of a molecular layer portion operating as a universal logic gate NAND/NOR, according to an embodiment of the disclosure.

In FIG. 22A, the case where the natural polarization state is imposed to the molecules of both input portions is illustrated. The central part of the processing portion is imposed to be in an anti-alignment condition, relative to the input polarization, and determines an opposite polarization (i.e., excited polarized state) in the molecules of the output portion.

Figure 22B:
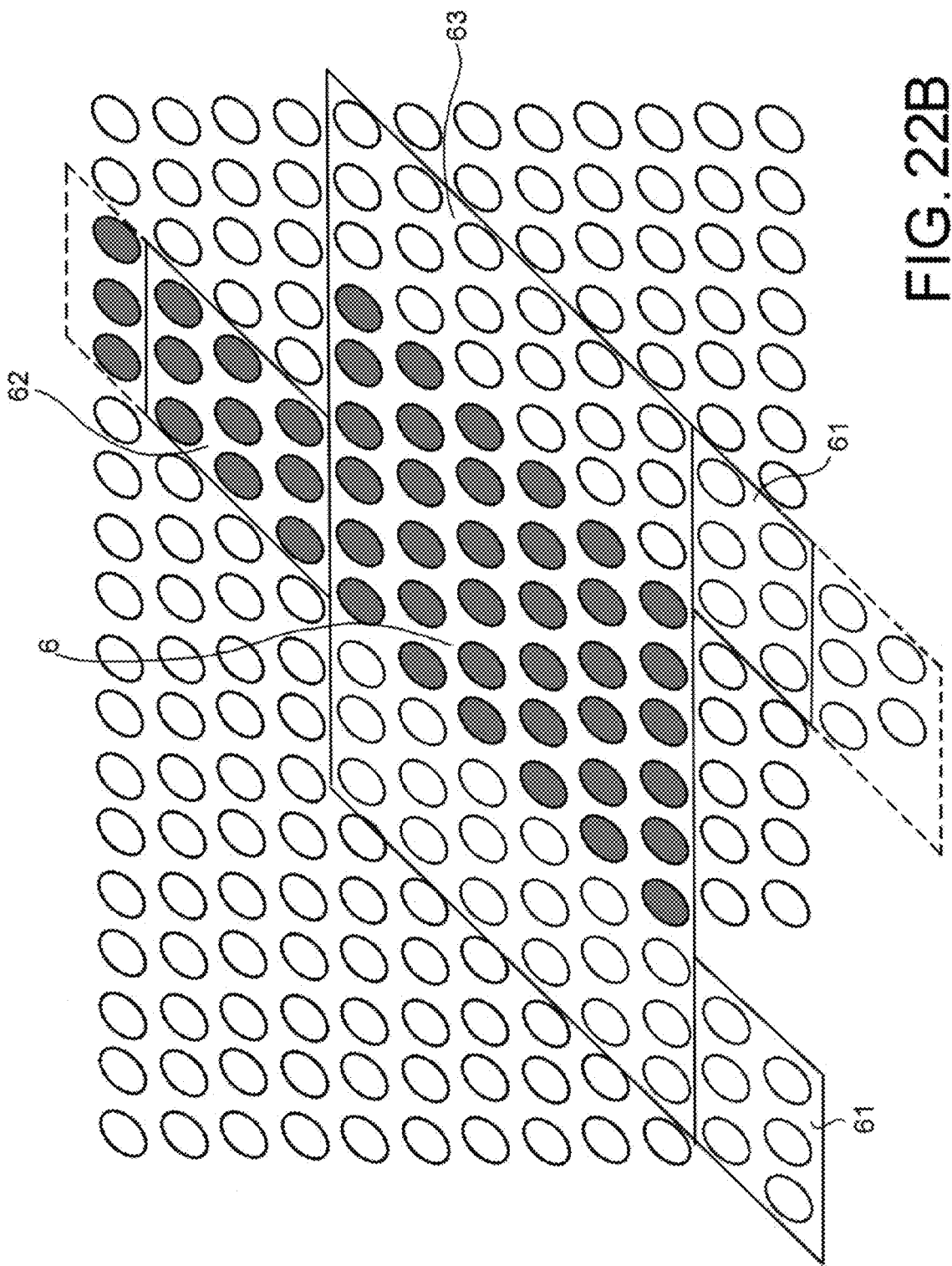

In FIG. 22B, the case where the excited polarization state is imposed to the molecules of both input portions is illustrated. The central part of the processing portion is imposed to be in an anti-alignment condition, relative to the input polarization, and determines an opposite polarization (thus, the natural polarization state) in the molecules of the output portion.

Figure 22C:
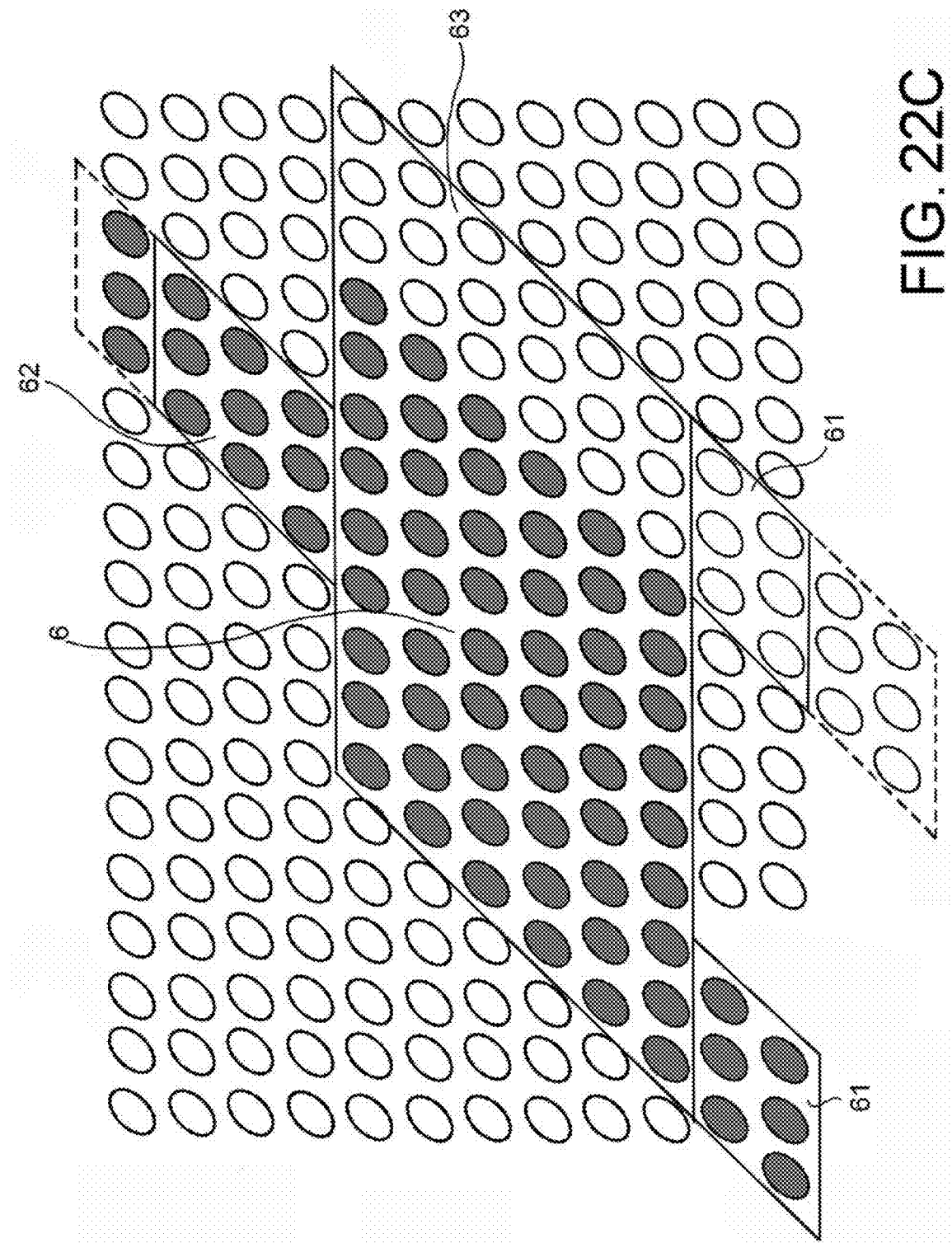
Figure 22D:
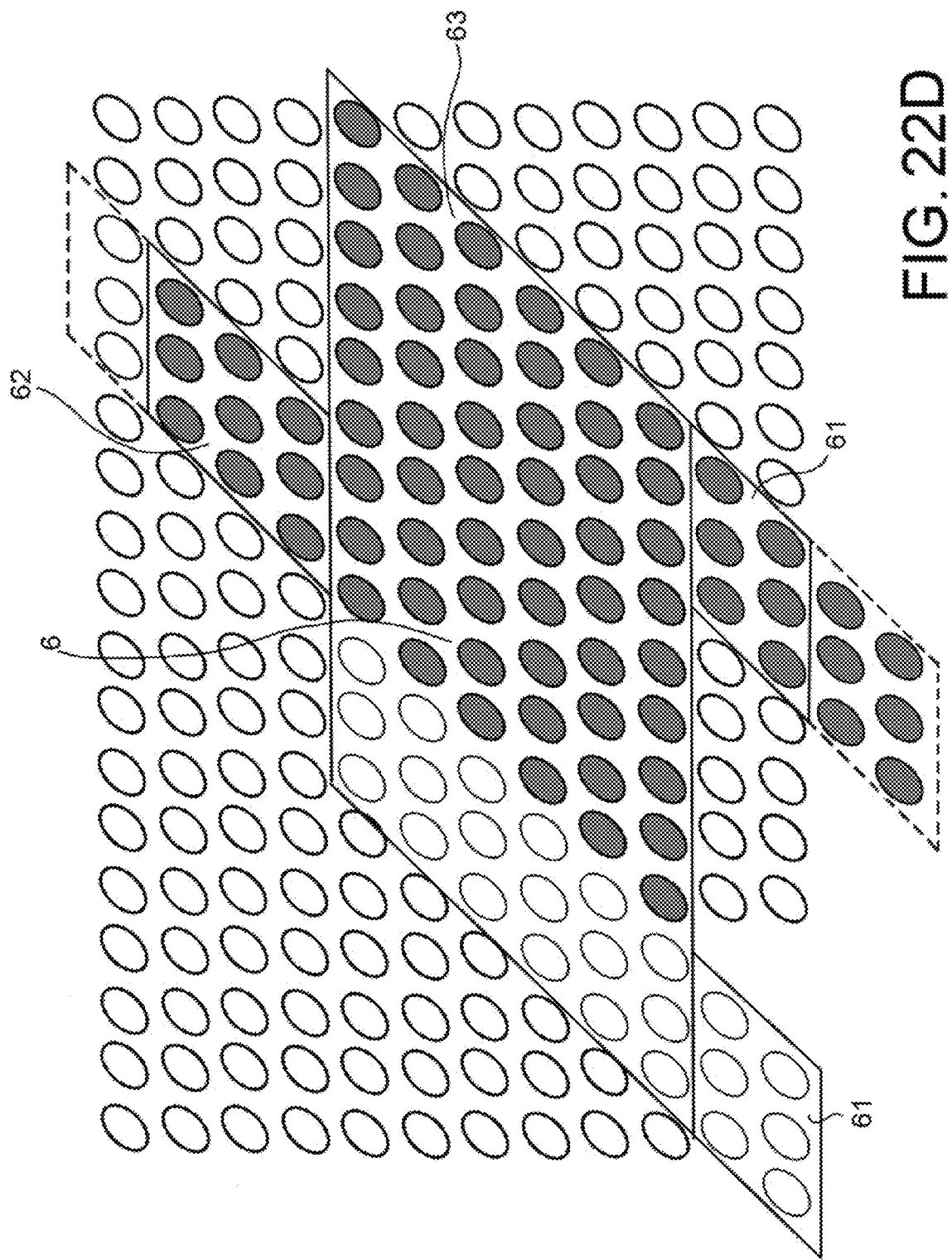

In FIGS. 22C and 22D, cases where the natural polarization state is imposed to the molecules of one input portion, while the excited polarization state is imposed to the molecules of the other input portion, are illustrated. Molecules of the central part of the processing portion, interacting in this case with adjacent portions having a different polarization, relax on the natural polarization state, thus bringing also the molecules of the output portion to the natural polarization state.

In table 2, a "truth table" is reported, describing the behavior of the logic gate illustrated above.

TABLE 2

| FIRST INPUT | SECOND INPUT | OUTPUT |
|---|---|---|
| BLACK | BLACK | WHITE |
| WHITE | WHITE | BLACK |
| WHITE | BLACK | BLACK |
| BLACK | WHITE | BLACK |

It shall be observed that the behavior of the functional unit described above is the behavior of a universal logic gate, because it corresponds to the function NAND or to the function NOR, according to the Boolean meaning assigned to the natural state (1 or 0).

Furthermore, on a same molecular layer, a plurality of universal logic gates and of transport lines or inverters, such as those previously described, can be obtained.

It is even possible to implement different functions, on the same molecular layer of the device, based on the same structure, by creating logic networks with several logic gates, by simply coding the Boolean signals into one or into the other way, and taking this into account, during the design stage, to mutually harmonize (e.g., by means of inverters) signals coming from areas of the layer in which different encodings are used.

Obviously, it is possible to implement a logic gate AND and a logic gate OR, by means of an inverter associated to a gate NAND and NOR, respectively.

The description reported above highlighted how the function performed by the functional unit (transport of binary signals, optionally with a periodic inversion, or processing one or more input signals to obtain an output signal) depends on both energy and geometric parameters (mutual orientation and position) of the molecules of the molecular layer, and on geometric parameters of the dielectric region (for example, direction and slope of the profiles etched in the dielectric, dimension and orientation of the cavities), and on a suitable coordination thereof. Such a coordination among the geometric parameters of the molecular layer and the geometric parameters of the dielectric region is defined in the design stage, according to the detailed information illustrated above.

In addition, it shall be observed that, according to a particular embodiment of the device, the first and second electrode regions are configured to provide a clock and/or synchronization signal to the functional units.

On the other hand, as already noticed, the first and second electrode regions are configured to provide a neutralization signal, directed to one or more molecules of the molecular layer, to control the transition thereof from or towards the neutral state. Therefore, according to an embodiment of the device, the above-mentioned clock signal and neutralization signal are the same signal, provided by the potential difference applied to the electrodes, such as to generate an electrode field, in turn modulated by the variable profile of the dielectric.

According to a further embodiment, the first and second electrode regions are further configured to provide one or more further input signals of the functional units. In such a case, the electrodes of the electrode region cooperate or replace the input electrodes that are co-planar with the molecular layer.

Figure 23:
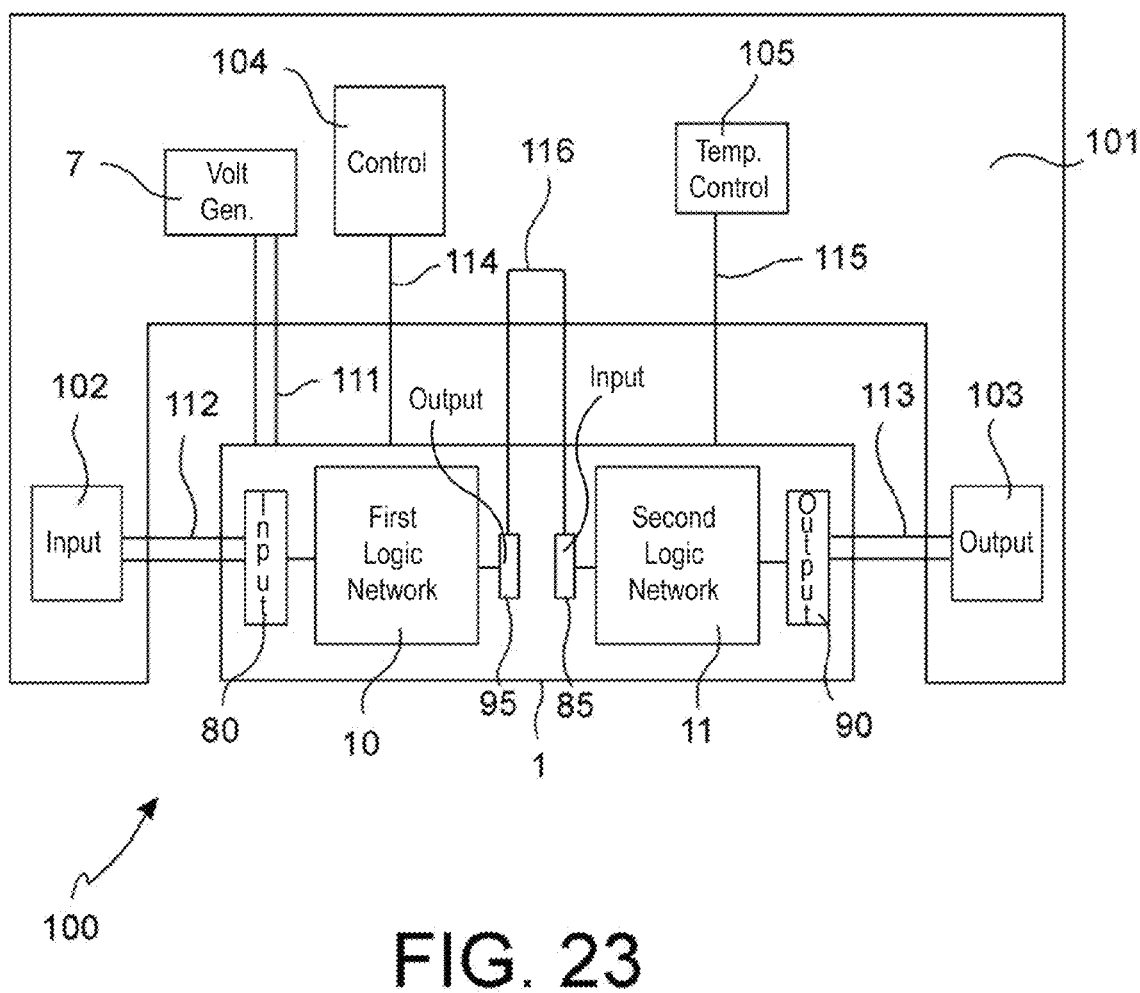
FIG. 23 represents a scheme of an implementation example of an electronic processing system, according to the present disclosure.

With reference to FIG. 23, an electronic processing system according to the present disclosure will be now described.

The processing system 100 comprises at least an electronic device 1 for implementing digital functions, according to any one of the embodiments described above. For sake of simplicity, the electronic device 1 is illustrated by a functional scheme, in the case where it comprises two logic networks 10, 11 (each of which is implemented by means of one or more functional units such as those described before), only one input element 80 of the device, connected to the first logic network 10, and only one output element 90 of the device, connected to the second logic network 11. The first logic network 10 also has its own output element 95; the second logic network 11 also has its own input element 85. Such a scheme can be clearly applied to embodiments providing any number of input elements, output elements and logic networks in the device.

As shown in FIG. 23, the processing system 100 further comprises an additional circuitry 101 for signal control, generation, and processing.

According to a preferred embodiment, the electronic device 1 for implementing digital functions and the additional circuitry 101 are integrated in the form of an integrated circuit contained in a relative package.

The additional circuitry 101 may comprise a voltage generator 7, connected through a first electrical connector 111 to the device 1 (particularly, to the device electrodes, not shown in FIG. 23) and configured to generate the potential difference ΔV between such electrodes.

In a further implementation example, the additional circuitry 101 comprises a plurality of voltage generators, connected by a plurality of first electrical connectors to a respective plurality of electrode pairs of the electrode region of the device, and configured to generate respective potential differences between each pair of the plurality of electrode pairs. Each of the mentioned potential differences is continuous or variable over time.

Furthermore, the additional circuitry 101 comprises at least one input module 102, connected, through a second electrical connector 112, to the at least one input element 80 of the device 1, to provide the respective at least one input signal.

Moreover, the additional circuitry comprises at least one output module 103, connected, through a third electrical connector 113, to the at least one output element 90 of the device 1, to receive and process the respective at least one output signal.

According to an implementation example, the output module 103 comprises a calibration module, configured to calibrate the dependence relationship between the polarization of the output molecules and the output signal generated by the output element of the device; and a voltage amplifier, to amplify the output signal.

In accordance with further implementation examples, the additional circuitry may comprise a control module or processor 104, connected to the device 1 through a fourth electrical connector 114; and a temperature control module 105, connected to the device 1 through a fifth electrical connector 115.

According to an embodiment, the additional circuitry 101 advantageously comprises a sixth electrical connector 116 between the output element 95 of the first logic network 10 and the input element 85 of the second logic network 11, allowing to implement complex functions by the cooperation of different logic networks and/or functional units of the same device. In this regard, it shall be noticed that the connection between more logic networks implemented in the same device, each being composed of one or more logic gates, according to the cases and to the needs, may occur externally to the device, through the sixth electrical connector 116; or through signal transport binary lines, within the same device.

In accordance with an embodiment, the mentioned first, second, third, fourth, fifth, and sixth electrical connectors are implemented by metallizations arranged on one or more metallization layers of the system.

From the previous description of the device, it can be also deduced the electronic computation method according to one embodiment of the present disclosure.

Such a method comprises the steps of: providing an electronic device 1 comprising a first electrode region 2 and a second electrode region 3, separated by an interposing region 4 comprising a dielectric region 40 having a spatially variable dielectric profile, in which the first 2 and the second electrode region 3 comprise respectively at least one first electrode 20 and at least one second electrode 30; further providing, within the interposing region 4 of the device 1, a molecular layer 5 comprising a plurality of molecules 50, each of which being capable of assuming one or more electric states, in a controllable manner, according to a sensed electric field E1; then, applying a potential difference $\Delta V$ between the first 20 and the second 30 electrodes, to generate an electrode electric field E in the interposing region 4; consequently, affecting the state of the molecules 50 of the molecular layer 5 by a spatial modulation of the electric field at the molecular layer, in which the spatial modulation depends on a spatially variable field profile determined by the spatially variable dielectric profile of the dielectric region 40.

According to an implementation example of the method, the potential difference $\Delta V$ applied between the first 20 and the second 30 electrodes varies over time, so as to cause a temporal variation of the electric field E generated in the dielectric region 40 and of the sensed electric field E1 at the molecular layer 5.

In accordance with a further implementation example, the method further comprises the steps of: providing a plurality of electrode pairs, in which each pair is formed by two electrodes belonging respectively to the first 2 and the second 3 electrode regions, and applying to each electrode pair a respective potential difference, which is constant over time or variable over time, according to a respective time trend.

In the following, a method for manufacturing an electronic device for implementing digital functions according to one embodiment of the disclosure, will be described.

Such a manufacturing method comprises the steps of: depositing an electrode region, comprising one or more metal electrodes; then, depositing a dielectric material region onto the electrode region; then, depositing, on an upper surface of the dielectric material region, in preset first positions, one or more input elements, each comprising a pair of input electrodes; subsequently, depositing, on the upper surface of the dielectric material region, in preset second positions, one or more output elements, each comprising an electrometer; furthermore, depositing on the upper surface of the dielectric material region, on a preset area depending on the above-mentioned preset first and second positions, a molecular layer comprising a plurality of molecules, each of which being capable of assuming one or more electric states, in a controllable manner, depending on a sensed electric field; then, depositing a further dielectric material region above the already deposited molecular layer, at least one input element, and at least one output element; finally, depositing a further electrode region, comprising one or more metal electrodes, above the further dielectric material region. In such a method, furthermore, at least one of the mentioned steps of depositing a dielectric material region and depositing a further dielectric material region comprises determining (i.e., fabricating) a spatially variable dielectric profile, in at least one of the respective dielectric region and further dielectric region.

According to a particular embodiment of the method, the step of depositing a dielectric region comprises: depositing at least one first dielectric layer, with a first dielectric permittivity value and having a spatial profile variable in a controlled manner; then, depositing at least one second dielectric layer with a second dielectric permittivity value and overlying the first dielectric layer, so as to obtain a spatially variable dielectric profile in the dielectric material region.

According to a particular embodiment of the method, the step of depositing a dielectric material region comprises: after depositing the first dielectric layer, etching the first dielectric layer to obtain engravings and/or cavities having preset shape, dimensions, and position, so as to determine the spatial profile, variable in a controlled manner, of the first dielectric layer.

According to further embodiments of the fabrication method, the first dielectric layer is composed of a first polymer, or polymer-ceramic material, and the dielectric etching step is carried out according to one of the following techniques:

soft lithography;
    engraving with heated and mobile nanometric tips.

Among the usable materials for the first dielectric layer, there are thermoplastic materials known as polyaryletherketones, characterized by a relevant temperature strength.

Another example is siloxane bis-benzocyclobutene (as reported, e.g., in *Appl. Phys. Lett.* 2004, vol. 84, n. 17, pp. 3400-3402), exhibiting excellent thermal and dielectric stability characteristics. According to a particular embodiment of the method, the second dielectric layer is composed of a second polymer, or polymer-ceramic material, having a curing temperature (where "curing" is also referred to as "cross-links formation", or "hardening", or "vulcanization") below the melting temperature of the first polymer material.

The curing conditions for the second polymer material, in terms of used temperature and time, take into account the fact that the first material, if a polymer, even at temperatures below the melting temperature, can generally undergo a viscosity increase (glassy transition) that, while not being a real transition of state, may lead to modification in the profiles that had been previously etched. By taking this into account, longer processes at lower temperatures are preferred in curing the second material. If it has been shown experimentally that the curing of the second material at least partially alters the etched surface of the first material, it is possible to pre-compensate such modifications, by taking them into account when arranging the first layer, e.g., by creating engravings which are deeper and/or have a partially different profile compared to the desired final result (which will be obtained later, after curing of the second material).

An example of a second polymer material for the second dielectric layer is a benzocyclobutene, in which barium titanate nanoparticles have been dispersed (as described, e.g., in *IEEE* 2007 *Electronic Components and Technology Conference*, pp. 453-457).

The depositing step of a dielectric material region further comprises: depositing, onto the etched surface of the first dielectric layer, the second polymer material in a liquid state; curing the second polymer material to its curing temperature, to obtain the second dielectric layer.

According to an implementation example, the depositing step of a dielectric material region is carried out by sputtering techniques.

In a possible embodiment, the etched dielectric layer—whether it is a polymer layer or not—is etched by the so-called Focused Ion Beam ablation technique.

In accordance with an embodiment of the method, the molecular layer is a planar molecular mono-layer, composed of molecules of a same type, arranged in a substantially regular grid having a substantially uniform and stable spatial orientation with reference to such a grid. The step of depositing a molecular layer comprises: depositing the molecular mono-layer through molecular immobilization in a liquid or dry environment, by self-assembling techniques.

When the selected substrate for the immobilization does not have intrinsically suitable characteristics for the deposition of the molecules according to the desired geometry, it is possible to deposit (e.g., by means of the above-mentioned self-assembling techniques), before the molecular layer with computational functions, one or more intermediate molecular layers, suitable to generate a grid with the suitable geometry of reactive sites, for the subsequent immobilization of the molecules. Also, assembling techniques of hybrid or mixed monolayers can be used, i.e., monolayers comprising, beside the molecular units for computation operations, other molecules evenly interposed among the first ones, and suitable to move them apart and advantageously affect the orientation thereof.

According to a further implementation example, the step of depositing the molecular layer further comprises: inducing the desired spatial orientation of the molecules of the molecular monolayer, by applying orientation control electric fields.

In accordance with an embodiment of the method, the step of depositing a further dielectric material region comprises: depositing a further polymer material layer having a curing temperature below the damaging temperature of the molecular layer; curing the further polymer material layer at its curing temperature.

In the case of siloxane bis-benzocyclobutene (mentioned as an example of a material for the first dielectric layer), the suitable curing conditions are, for example, temperatures ranging from 230° C. to 290° C. along time intervals ranging from a few seconds to 12 minutes; the cured material has glassy transition temperature above 250° C. By using benzocyclobutene with dispersed barium titanate particles as a second material for the second dielectric layer, curing occurs even at temperatures below 250° C., along time intervals up to some hours.

In such examples, the relative dielectric constant of the first material ranges between 2 and 3; the relative dielectric constant of the second material is above 50. Both materials resist to electric fields of the order of 300 MV/m, a value that is compatible with the electric fields used for the molecules.

It shall be noticed that, advantageously, the dielectric material layers deposited later, and overlying other dielectric material layers, have lower and lower curing temperatures.

Finally, one embodiment of the disclosure a method for manufacturing an integrated electronic processing system. Such a method comprises the steps of: manufacturing a device according to a manufacturing method in accordance with what has been described above; then, manufacturing an additional integrated circuitry for signal control, generation, and processing; then, connecting the device and the additional integrated circuitry, so as to form a single integrated circuit; finally, placing the integrated circuit in a package for integrated circuits.

According to an implementation example, the step of manufacturing an integrated circuitry comprises depositing one or more metallization layers, and the step of connecting comprises connecting by metal connections such one or more metallization layers of the integrated circuitry to electrode regions or input electrodes or electrometers of the device.

In fact, the functional elements of the device, and the related computational method, work on the basis of physical quantum phenomena, on a nano-scale, and keeping into account and exploiting the intrinsic characteristics of non-perfect symmetry of the molecules, on such a scale.

Moreover, the basic functional structure of the device is a molecular layer that is not formed by lithographic techniques, since the functionality of the functional elements composed of one or more molecules of the layer is determined and differentiated by a profile of the dielectric region adjacent to the molecular layer. This aspect makes the device according to one embodiment of the disclosure able to implement complex logic networks and to become the nano-electronic core of a complex high-performance electronic processor, by arranging the profiling of the dielectric region.

Furthermore, the dielectric profiling can determine the functionality of the molecular layer on the two dimensions on which it extends, providing a considerable and advantageous flexibility in the design of the logic network.

The related method for manufacturing the device, according to the disclosure, further allows to move the application of lithographic techniques from the nano-scale conformation of the molecular layer to a simple profiling operation, for example by engraving of the dielectric region on a variation scale corresponding to a group of molecules, not to a single molecule, which can be performed by relatively simple techniques, while keeping limited the complexity and cost of the device manufacturing.

Finally, the device according to the disclosure is perfectly compatible with the application of integrated microelectronics standard techniques for implementing each type of additional circuitry that can be used to build any electronic processing system around the electronic device according to the disclosure.

To the embodiments of the electronic device for implementing digital functions, the manufacturing method of such a device, the system employing the device, and the computational method implemented by the device, described above, one of ordinary skill in the art, in order to meet contingent needs, will be able to make modifications, adaptations, and replacements of elements with other functionally equivalent ones, also in combination with the prior art, also generating hybrid implementations, without departing from the scope of the present disclosure. Each of the characteristics described as belonging to a possible embodiment can be implemented independently from the other embodiments described.

The various embodiments described above can be combined to provide further embodiments. These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A method for electronic computation through implementation of digital functions, comprising:
   applying a potential difference between a first electrode and a second electrode of an electronic device that includes an interposing region between the electrodes, the interposing region including a dielectric region having a spatially variable dielectric profile, the interposing region including a molecular layer that includes a plurality of molecules, each configured to assume one or more electric states in a controllable manner according to a sensed electric field, the applying including generating an electrode electric field in the interposing region; and
   affecting the states of the molecules of the molecular layer by spatially modulating the sensed electric field at the molecular layer, said spatially modulating depending on a spatially variable field profile determined by the spatially variable dielectric profile of the dielectric region.

2. The method according to claim 1, wherein the applying includes varying the potential difference over time, the varying causing a temporal variation of the electric field generated in the dielectric region and of the sensed electric field at the molecular layer.

3. A method for manufacturing an electronic device for implementing digital functions, said method comprising:
   depositing a first electrode region that includes one or more electrodes;
   depositing a first dielectric material region onto said first electrode region;
   depositing, on an upper surface of the first dielectric material region, in preset first positions, one or more input elements, each including a pair of input electrodes;
   depositing, on said upper surface of the first dielectric material region, in preset second positions, one or more output elements, each including an electrometer;
   depositing, on said upper surface of the first dielectric material region, on an area preset according to said preset first positions and preset second positions, a molecular layer including a plurality of molecules, each capable of assuming one or more electric states, in a controllable manner, according to a sensed electric field;
   depositing a second dielectric material region above said molecular layer, said at least one input element, and said at least one output element;
   depositing a second electrode region, including one or more electrodes, above said second dielectric material region;
   wherein at least one of depositing the first dielectric material region and depositing the second dielectric material region comprises providing a spatially variable dielectric profile, in at least one of the first and second dielectric material regions.

4. The manufacturing method according to claim 3, wherein depositing the first dielectric region comprises:
   depositing a first dielectric layer with a first dielectric permittivity value;
   etching said first dielectric layer, thus obtaining cavities and/or engravings with preset shape, dimensions and position, so as to determine a spatial profile, variable in a controlled manner, of said first dielectric layer;
   depositing a second dielectric layer with a second dielectric permittivity value, overlying and in direct contact with the first dielectric layer so as to fill said cavities and/or engravings thereof, so as to obtain the spatially variable dielectric profile in the least one of the first and second dielectric material regions.

5. The manufacturing method according to claim 4, wherein the first dielectric layer is composed of a first polymer or polymer-ceramic material, and wherein the etching is implemented according to one of the following techniques:
   soft lithography;
   engraving with heated and mobile nanometric tips.

6. The manufacturing method according to claim 5, wherein:
   the second dielectric layer is composed of a second polymer or polymer-ceramic material having a curing temperature below a melting temperature of the first polymer or polymer-ceramic material; and
   depositing the first dielectric material region further comprises:
   depositing, onto the etched surface of the first dielectric layer, the second polymer or polymer-ceramic material in a liquid state;
   curing the second polymer or polymer-ceramic material to the respective curing temperature, to obtain said second dielectric layer.

7. The manufacturing method according to claim 3, wherein the molecular layer is a locally planar molecular monolayer, composed of molecules of a same type, arranged in a substantially regular grid, said molecules having a substantially uniform and stable spatial orientation, and wherein depositing a molecular layer comprises:
- depositing the molecular monolayer through molecular immobilization in a liquid or dry environment, by self-assembling techniques;
- inducing the substantially uniform and stable spatial orientation of the molecules of the molecular monolayer by applying orientation control electric fields.

8. A method of manufacturing an electronic device for implementing digital functions, the method comprising:
- forming an interposing region that includes a first dielectric region; and
- forming a first electrode region and a second electrode region separated from each other by the interposing region, wherein said first and second electrode regions include a first electrode and a second electrode, respectively, that are configured to generate an electrode electric field in the interposing region depending on an electric potential difference to be applied to the first and second electrodes, wherein:
- forming the interposing region includes forming a molecular layer including a plurality of molecules, each configured to be responsive to a sensed electric field and assume one or more electric states, in a controllable manner, according to the sensed electric field; and
- forming the interposing region includes forming said first dielectric region with a spatially variable dielectric profile that is configured to define a corresponding field profile of said electrode electric field and to spatially modulate said sensed electric field at the molecular layer.

9. The method according to claim 8, wherein said molecules are electrically bistable molecules, have charges suitable to be confined in a controllable manner, by electrostatic interaction, depending on the sensed electric field.

10. The method according to claim 9, wherein each molecule is configured to alternatively assume a neutral state and one of two polarized states, having different energy levels compared to the neutral state, each polarized state having a respective polarization of the charges.

11. The method according to claim 8, wherein forming the molecular layer includes forming the molecular layer as a locally planar molecular layer, the molecules are of a same type, are arranged in a substantially regular grid, and have, with reference to said grid, a substantially uniform and stable spatial orientation, said molecular layer being a monolayer, having a thickness of a single molecule.

12. The method according to claim 11, comprising:
- arranging the first and the second electrodes on two mutually parallel electrode planes;
- extending the first dielectric region between the two electrode planes; and
- arranging the molecular layer between the first dielectric region and the first electrode region, wherein the molecular layer is planar and substantially parallel to the electrode planes; and
- interposing a second dielectric region between the molecular layer and the first electrode region, wherein the molecular layer is planar and substantially parallel to the electrode planes.

13. The method according to claim 11, comprising:
- forming a plurality of cavities or engravings, having preset shape, dimensions, and positions, in a surface of a dielectric layer of the first dielectric region, wherein the spatially variable dielectric profile of the first dielectric region depends on the shape, dimensions and positions of said plurality of cavities or engravings.

14. The method according to claim 8, wherein:
- logically grouping the molecules of the molecular layer to form functional units that are configured to implement respective digital functions; and
- each functional unit comprises a uniform portion of the molecular layer made of molecules of the same type.

15. The method according to claim 14, wherein the digital function performed by each functional unit depends on the electrostatic interaction between the functional unit molecules, a mutual orientation and/or position of the molecules of the functional unit, and the spatially variable dielectric profile.

16. A method of making an electronic device for implementing digital functions, the method comprising:
- forming an interposing region that includes a first dielectric region and a molecular layer including a plurality of molecules arranged in a plane;
- forming a first electrode and a second electrode separated from each other by the interposing region and configured to generate a first electrode electric field in the interposing region depending on an electric potential difference to be applied to the first and second electrodes; and
- forming a third electrode and a fourth electrode arranged in the plane of the molecules and positioned on opposite sides of at least a subset of the molecules in the plane, wherein:
- the third and fourth electrodes are configured to generate a second electrode electric field in the interposing region depending on an electric potential difference to be applied to the third and fourth electrodes;
- each of the plurality of molecules is configured to be responsive to a sensed electric field and assume one or more electric states, in a controllable manner, according to the sensed electric field; and
- said first dielectric region has a spatially variable dielectric profile that is configured to define a corresponding field profile of said first electrode electric field and to spatially modulate said sensed electric field at the molecular layer.

17. The method according to claim 16, wherein each molecule is configured to alternatively assume a neutral state and one of two polarized states, having different energy levels compared to the neutral state, each polarized state having a respective polarization of the charges.

18. The method according to claim 16, comprising:
- arranging the first and the second electrodes on two mutually parallel electrode planes;
- extending the first dielectric region between the two electrode planes;
- arranging the molecular layer between the first dielectric region and the first electrode region, the plane of the molecular layer being substantially parallel to the electrode planes; and
- forming a second dielectric region interposed between the molecular layer and the first electrode region.

19. The method according to claim 16, wherein forming the first dielectric region comprises:
- forming a first dielectric layer having a first electric permittivity value, and having, relative to a direction perpendicular to the plane of the molecular layer, a first dielectric thickness; and
- forming a second dielectric layer overlying the first dielectric layer, having a second electric permittivity value that is different from the first electric permittivity value, and having, relative to a direction perpendicular to the plane of the molecular layer, a second dielectric thickness, said first dielectric thickness and second dielectric thickness being spatially variable so as to define the spatially variable dielectric profile.

20. The method according to claim 16, comprising:

forming a plurality of cavities or engravings, having preset shape, dimensions, and positions, in a surface of a dielectric layer of the first dielectric region, wherein the spatially variable dielectric profile of the first dielectric region depends on the shape, dimensions and positions of said plurality of cavities or engravings.

* * * * *